United States Patent [19]
Kamogawa et al.

[11] Patent Number: 5,973,575
[45] Date of Patent: Oct. 26, 1999

[54] FULLY MONOLITHIC VOLTAGE CONTROLLED OSCILLATOR WITH WIDE TUNING RANGE

[75] Inventors: Kenji Kamogawa; Kenjiro Nishikawa; Ichihiko Toyoda; Tsuneo Tokumitsu, all of Tokyo, Japan

[73] Assignee: Nippon Telegraph and Telephone Corp., Tokyo, Japan

[21] Appl. No.: 09/022,536

[22] Filed: Feb. 12, 1998

[30] Foreign Application Priority Data

Feb. 14, 1997 [JP] Japan ................................. 9-044876

[51] Int. Cl.$^6$ ............................................. H03B 5/12
[52] U.S. Cl. ..................... 331/117 R; 331/34; 331/36 C; 331/96; 331/117 D; 331/177 R; 331/177 V
[58] Field of Search ..................... 331/34, 36 C, 331/96, 117 R, 117 FE, 117 D, 177 R, 177 V

[56] References Cited

U.S. PATENT DOCUMENTS

| | | | |
|---|---|---|---|
| 5,075,643 | 12/1991 | Einbinder ................................ | 332/135 |
| 5,144,264 | 9/1992 | Chong et al. ......................... | 331/117 R |
| 5,347,238 | 9/1994 | Kobayashi ........................... | 331/117 R |
| 5,565,821 | 10/1996 | Murtojarvi ........................... | 331/117 D |

FOREIGN PATENT DOCUMENTS 6-140836  5/1994  Japan .

OTHER PUBLICATIONS

I.D. Robertson, "MMIC Design" The Institution of Electrical Engineers, London, UK, p. 364, 1995, ISBN 0–85296–816–7.

Kamogawa et al., "A Very Wide–Tuning Range 5–GHz–Band Si bipolar VCO Using Three–Dimensional MMIC Technology", The Institute of Electronics, Information and Communication in Japan, General Meeting Report, C–2–39, p. 94, Osaka, Japan, Mar. 24–27, 1997.

"Varactorless VCO's: Transistors go it Alone", O'Clock Jr., *Microwaves and RF*, vol. 23, No. 6, Jun. 1984, pp. 137–142.

Patent Abstracts of Japan, vol. 018, No. 447 (E–1594), Aug. 19, 1994 and JP 06 140836 A.

"MMIC 14–GHz VCO and Miller Frequency Divider for Low–Noise Local Oscillators", Ohira et al, *IEEE Transactions on Microwave Theory and Techniques*, vol. MTT–35, No. 7, Jul. 1987, pp. 657–662.

"A Novel Heterojunction Bipolar Transistor VCO Using an Active Tunable Inductance", Kobayashi et al, *IEEE Microwave and Guided Wave Letters*, vol. 4, No. 7, Jul. 1994, pp. 235–237.

"0.5–$\mu$m Bipolar Technology Using a New Base Formation Method: SST1C", Yamaguchi et al, IEEE 1993 Bipolar Circuits and Technology Meeting 4.2, pp. 63–66.

"A Very Wide–Tuning Range 5–GHz–band Si Bipolar VCO Using Three–Dimensional MMIC Technology", Kamogawa et al, *IEEE MTT–S Digest*, 1997, pp. 1221–1224.

"Wide Tuning Range Si Bipolar VCO's Based on Three–Dimensional MMIC Technology", Kamogawa et al, *IEEE Transactions on Microwave Theory and Techniques*, vol. 45, No. 12, Dec. 1997, pp. 1–8.

*Primary Examiner*—David Mis
*Attorney, Agent, or Firm*—Nikaido Marmelstein Murray & Oram LLP

[57] ABSTRACT

A voltage controlled oscillator for wide tuning range of frequency with less phase noise has a bipolar transistor provided with a positive feedback circuit between a base and an emitter of the transistor, an impedance matching circuit coupled with a collector of the transistor and an output terminal, a resistor coupled between the base of the transistor and a control source which provides control voltage for adjusting oscillation frequency of the oscillator. The base of the transistor shows capacitive negative impedance, and an inductive element is coupled with the base of the transistor for oscillation. The emitter of the transistor is grounded for D.C. voltage through an inductor or a transmission line, or coupled with a control voltage.

17 Claims, 21 Drawing Sheets

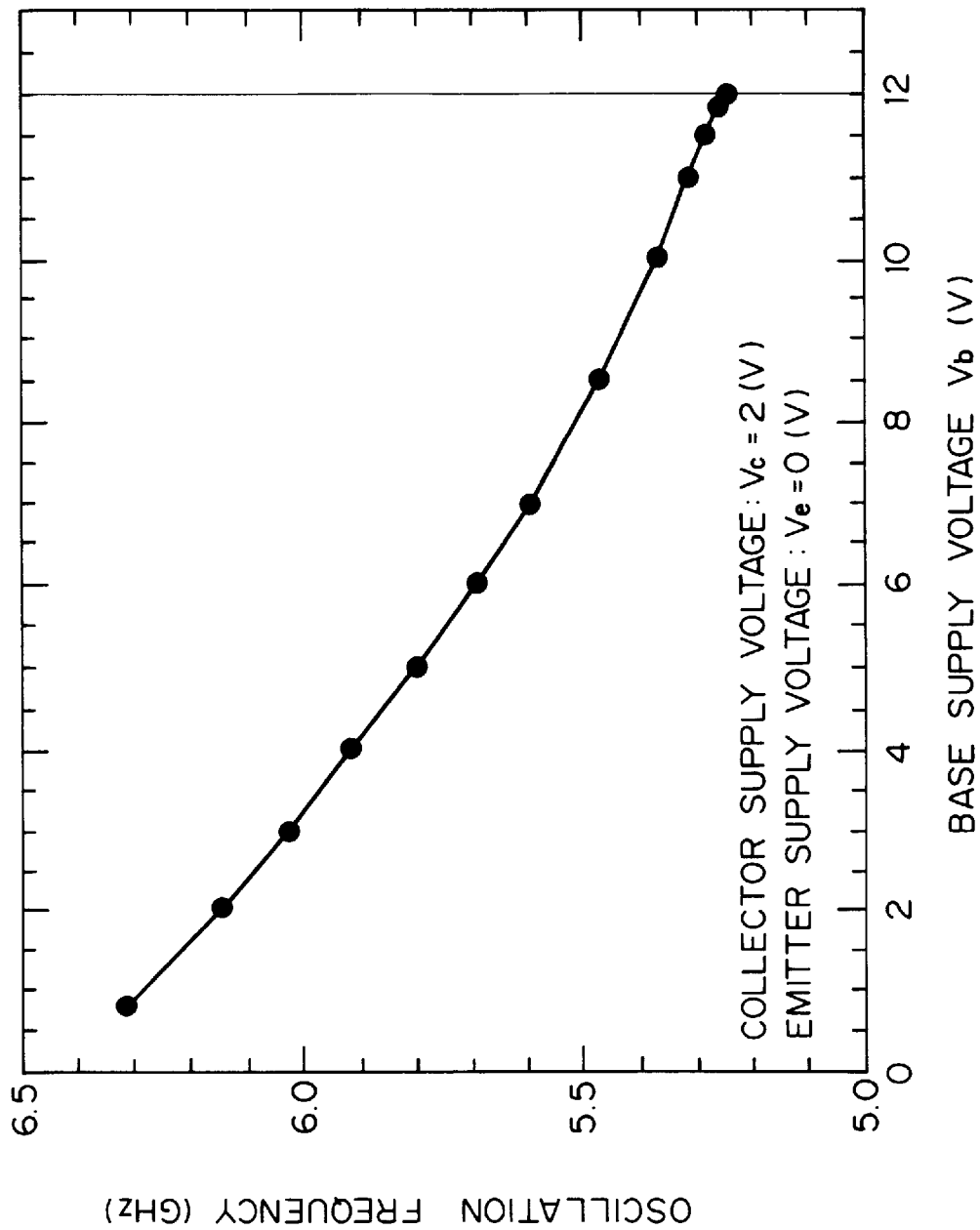

0

FULLY MONOLITHIC VOLTAGE CONTROLLED OSCILLATOR WITH WIDE TUNING RANGE

BACKGROUND OF THE INVENTION

The present invention concerns a voltage controlled oscillator used in local oscillators and synthesisers of radio equipments for microwave and millimeter-wave frequency systems.

The present invention is used in a personal radio tranceiver such as a gate card or a security card, an AWA (ATM wireless access) radio terminal, and a mobile terminal, in which an oscillator is essential.

A local oscillator is an essential component in a microwave transmitter/receiver equipment. There is a tendency to provide a local oscillator in a monolithic micro-wave integrated circuit (MMIC) so that a small sized, low-cost, and high function radio tranceiver is obtained.

A conventional PLL (phase lock loop) local oscillator has high frequency stability and low phase noise close to a carrier frequency because of the use of a crystal oscillator as reference signals. A PLL local oscillator comprises essentially a voltage controlled oscillator, a frequency divider, and a phase frequency comparator. Among them, a voltage controlled oscillator is a key component for defining characteristics of a PLL local oscillator, and therefore, it is desired that it has high frequency stability, high output level, wide frequency vary range, and low phase noise. In particular, a software radio (for instance, a Personal Digital Cellular (PDC) phone in Japan, Global System for Mobile communications (GSM) in Europe, and IS-95 in U.S.A. are handled by a single tranceiver by switching with a software) has been studied so that various frequency bands, various modulation schemes, and various data formats are handled by modifying a software. Therefore, an oscillator which has wide frequency tuning range has been strongly required so that it meets with requests for various frequency bands.

FIG. 25 shows a prior voltage controlled oscillator (I. D. Robertson, "MMIC Design", The Institution of Electrical Engineers, London, UK, p.364,1995, ISBN 0-85296-816-7). In the figure, the numeral 100 is an FET which operates as an oscillation element with a gate terminal 111 grounded through an inductor 121 and coupled with an anode 151 of a varactor 150 which is a voltage controlled variable capacitance element through an inductor 120. A cathode 152 of a varactor diode 150 is coupled with a control voltage input terminal 114 through a resistor 140, and is grounded through a capacitor 130. A source terminal 113 is coupled with an inductor 122 and a capacitor 131. The inductor 122 is grounded through a resistor 141, and the capacitor 131 is directly grounded. A drain terminal 112 is coupled with a drain voltage supply terminal 115 through an inductor 123, and also coupled with an output terminal 110 through an inductor 124 and a capacitor 133. The drain voltage supply terminal 115 is grounded through a capacitor 132. An output matching circuit is composed of inductors 123 and 124, and capacitors 115 and 133.

When said terminal 115 is supplied with drain voltage, the gate of the FET 100 provides capacitive negative impedance, and therefore, a voltage controlled oscillator is obtained by coupling a variable inductance with the gate 111 of the FET. The variable inductance in the prior art is composed of a varactor diode 150 and an inductor 120. Said varactor diode 150 is coupled with a source and a drain of the FET, and controls parallel sum of capacitance $C_{gs}$ between a gate and a source, and capacitance $C_{gd}$ between a gate and a drain according to the control voltage. The circuit of FIG. 25 may be integrated on a semiconductor substrate, and provides a reproducible and a low cost circuit.

However, the circuit of FIG. 25 which has a varactor diode for providing a variable reactance has the disadvantage that the control range of the capacitance $C_{gs}$ between a gate and a source is only around 1:2 or less when it is implemented as a monolithic micro-wave integrated circuit (MMIC) integrated on a semiconductor substrate, and resultant frequency control range is also small.

Another disadvantage of the circuit of FIG. 25 is that it needs more than two active elements, a negative impedance element (FET) and a varactor. This means that the yield rate in production decreases in higher operational frequency. Further, phase noise characteristics is degrades, since low frequency noise component (1/f noise) is up-converted up to oscillation frequency through mixing effect by non-linear characteristics by a plurality of active elements.

FIG. 26 shows another prior voltage controlled oscillator which is shown in JP patent laid open 140836/1994. In the figure, the numeral 200 is a transistor which operates as an oscillation element, with a base terminal 211 grounded through a resistor 208 and coupled through a capacitor 201 with a transmission line 210, the other end of which is grounded through a capacitor 202. Said base terminal 211 is further coupled with a base voltage control terminal 214 and a capacitor 203 through a resistor 207. The other end of the capacitor 203 is grounded. The emitter terminal 213 of the transistor 200 is grounded through a parallel circuit of a resistor 209 and a capacitor 204, and is further coupled with the base terminal 211 through a capacitor 205. The collector terminal 212 of the transistor 200 is connected to a collector voltage control terminal 215, which is grounded through a capacitor 206.

In the circuit of FIG. 26, the resistor 209 provides negative resistance so that the base terminal 211 of the transistor 200 provides capacitive negative impedance. Therefore, when an inductive transmission line 210 is coupled with the base terminal, the circuit of FIG. 26 works as an oscillator. The oscillation frequency of the voltage controlled oscillator depends upon the voltage difference between the base voltage control terminal 214 and the collector voltage control terminal 215 so that the capacitance between the base and the collector is adjusted.

The circuit of FIG. 26 has the advantage as compared with the circuit of FIG. 25 that no varactor diode which is a variable reactance element is necessary, but only one transistor is enough as an active element for providing a frequency controlled oscillator. Therefore, the circuit of FIG. 26 improves the producing yield rate approximate twice as compared with the circuit of FIG. 25, and further decreases non-linear element in a feedback circuit so that phase noise is lowered.

However, the circuit of FIG. 26 has the disadvantage that the control range of the capacitance between the base and the collector is less than 1:2, therefore, large control range of the oscillation frequency is impossible in the circuit of FIG. 26.

The circuit of FIG. 26 is further analyzed for D.C. (direct current) operation. The current in a transistor depends upon the voltage between a base and an emitter. In the case of npn transistor, when voltage is applied to a base, potential barrier of a base-emitter junction is decreased, an electron in an emitter is injected into a base, and if width of a base is sufficiently small, almost all the electrons injected to a base reach a base-collector junction and flows into a collector (current flows from a collector to an emitter). Therefore, voltage between a base and an emitter must be controlled freely so that base current (or emitter current) of a transistor is adjusted.

However, the resistor 209 which operates to provide negative resistance in the voltage controlled oscillator in FIG. 26 restricts the range of the voltage between a base and an emitter. The voltage $V_{ee}$ applied to the emitter terminal 213 must shift by voltage drop by emitter current $I_e$ in the resistor 209. Even if voltage at the base voltage control terminal 214 is increased so that base current (or emitter current) increases, the voltage between the base and the emitter does not so increase because of the voltage drop in the resistor 209, and therefore, the base current does not increase. To confirm above principle, the considerable circuit model using commercial transistors are calculated. The calculated results is explained in detail in accordance with FIG. 27.

It is assumed that voltage is applied to a base through a resistor of 1 KΩ, and to a collector through an inductor of 1 μH, and collector voltage is fixed to 1 V. A transistor used for calculation is an SSTIC bipolar transistor (C. Yamaguchi, Y. Kobayashi, M. Miyake, K. Ishii, and H. Ichino, "0.5-μm bipolar Transistor Using a New Base Formation Method; SSTIC," in IEEE 1993 Bipolar Circuits and Technology Meeting, 4.2, pp.63–66). The size of an emitter is 0.3 μm×120.6 μm. The current-voltage characteristic of a transistor itself is shown in FIG. 28.

An SSTIC bipolar transistor increases exponentially emitter current and base current as the base-emitter voltage increases as is the case of an ordinary transistor.

FIG. 29 shows numerical calculation showing relationship between voltage of a base voltage control terminal, and voltage between a base and an emitter, in the circuit of FIG. 26, where $R_1$ is resistance of the resistor 209. It should be noted that as the resistance coupled with an emitter increases, the maximum voltage between a base and an emitter decreases, and therefore, base current (and emitter current) flowing in a transistor decreases.

Therefore, the circuit of FIG. 26 can not provide large emitter (or collector) current, and it is difficult to provide large oscillation output. Further, in the circuit of FIG. 26, the resistance of the resistor 209 must be high to provide large negative resistance, and the resistor 209 is essential for oscillation operation. If the resistance of the resistor 209 is zero, no negative resistance is provided, and no oscillation operation is provided.

As described above, the circuit of FIG. 26 has the disadvantage that the control range of the voltage between a base and an emitter is restricted, although the voltage between a collector and a base is controllable arbitrary.

SUMMARY OF THE INVENTION

An object of the present invention is to overcome the disadvantages and limitations of a prior voltage controlled oscillator by providing a new and improved voltage controlled oscillator.

It is also an object of the present invention to provide a voltage controlled oscillator which has wide frequency tuning range, and low phase noise.

The important feature of the present invention resides in a voltage controlled oscillator comprising; a first transistor having a positive feedback circuit between a base and an emitter of said transistor; an oscillation output of the oscillator being provided from a collector of said transistor to an output terminal through an impedance matching circuit; an inductor element coupled with the base of said transistor; a control source for providing respective adjustable potential to said base and said emitter of said transistor; said impedance matching circuit having a power supply terminal for supplying collector voltage to the collector of said transistor; and a first resistor provided between the base of said transistor and said control source.

In an embodiment (FIG. 1 and FIG. 2) of the present invention, it should be noted that base-emitter resistance of a transistor operates as a varistor which changes resistance of the same with large change ratio depending upon base current. Said varistor is used in the present invention as a variable reactance element with large change ratio so that larger frequency tuning range of a voltage controlled oscillator is obtained than that of a prior voltage controlled oscillator which uses a varactor.

A transistor used in the present invention is a current source type transistor such as a bipolar transistor. The deterioration of transconductance gm of a current source type transistor is smaller when control voltage (base current in case of a current source type transistor, and gate voltage in case of an FET) is adjusted than that of a voltage source type transistor such as an FET. Therefore, an effect of a varistor is used advantageously in case of a current control type transistor.

Further, phase noise of a voltage controlled oscillator is generated through up-conversion of 1/f noise by an active device to oscillation frequency because of mixing effect of non-linear characteristics of an oscillation element and/or a variable reactance element (a varactor in a prior art). On the other hand, a variable reactance in the present invention is implemented by a varistor characteristics in a transistor which operates as an oscillation element, and therefore, active devices except a transistor for negative resistance generator are removed. in the present invention, and thus, an oscillator with low phase noise is obtained in the present invention.

Further, as a voltage controlled oscillator according to the present invention has only one transistor as an active element, it is suitable to produce through MMIC fabrication process, and it is expected that producing yield rate is twice as high as that of the prior art of FIG. 25. Thus, the present invention is very economical.

Further, generally, oscillation frequency changes rapidly because base current of a transistor increases exponentially with base-emitter voltage as shown in FIG. 28. On the other hand, according to the present invention, as a resistor is inserted between a base and a base voltage control terminal, voltage applied to a base terminal changes slowly by the voltage drop effect by current in the resistor. Thus, the present voltage controlled oscillator is excellent in control characteristics against the base-emitter voltage. When the resistance of said resistor between a base and a base voltage control terminal is sufficiently large, it can be neglected equivalently in analyzing circuit operation at oscillation frequencies, the control terminal scarcely affects to the operation of an oscillator.

Since emitter voltage is applied through a transmission line and/or an inductor, emitter potential is fixed or independent from the volume of emitter current. Therefore, base-emitter voltage can be arbitrary adjusted, and therefore, control range of base current is considerably increased. The second prior art has no such advantage.

In an embodiment (FIG. 3) of the present invention, a load in an output side is directly coupled with an emitter through a capacitor, and therefore, the load operates not only as a load itself but also as an element for providing negative resistance. When oscillation condition is designed considering said load in an output side, no output impedance matching circuit is necessary. Therefore, the embodiment of FIG. 3 has the advantages as compared with that of FIGS. 1 and 2 that size of a circuit is considerably decreased by removing an impedance matching circuit, and reflection characteristics in an output side is improved.

In another embodiment (FIGS. 4 and 5) of the present invention, an emitter of a transistor is short-circuited to ground through an inductor or a transmission line so that D.C. potential of an emitter is always kept zero. Thus, no emitter voltage control terminal is necessary, and a circuit is simplified.

In another embodiment (FIGS. 6 and 7) of the present invention, a second resistor coupled between a base and an emitter of a transistor is parallel to a base-emitter resistance $R_{be}$ of the transistor, so that the range of the base-emitter resistance (varistor) may be adjusted. Further, as the second resistor stabilizes base-emitter voltage, the control characteristics of a voltage control oscillator is improved.

In another embodiment (FIGS. 8 and 9) of the present invention, a capacitor coupled in a circuit increases the value of Q of a resonator. Thus, phase noise in an output signal is lowered.

In still another embodiment (FIGS. 16 and 17), base voltage is supplied by dividing collector voltage by using resistors, thus, a base voltage control terminal is removed, and a circuit structure is simplified.

In another embodiment (FIGS. 10 and 11) of the present invention, a varisber coupled in a circuit modifies the frequency tuning sensitivity versus control voltage. Therefore, the control flexibility of oscillation frequency is improved.

In still another embodiment (FIGS. 12A through 15B and FIGS. 18 and 19), a variable reactance element is coupled in a circuit so that frequency control range is further increased, and further, frequency tuning sensitivity for control voltage is improved and adjusted.

In still another embodiment, a transistor is a bipolar transistor, and the transistor is produced on a silicon substrate. A bipolar transistor offers lower 1/f noise than metal-semiconductor field effect transistor's (MESFET's) and high electron mobility transistors (HEMT's). Therefore, further lower phase noise is obtained in a voltage controlled oscillator.

BRIEF DESCRIPTION OF THE DRAWINGS

The foregoing and other objects, features, and attendant advantages of the present invention will be appreciated as the same become better understood by means of the following description and the drawings wherein;

FIG. 22B shows calculated relations between base supply voltage and oscillation frequency of a 5 GHz band voltage controlled oscillator using a silicon bipolar transistor (SSTIC) in the second embodiment of the present invention.

DESCRIPTION OF THE PREFERRED EMBODIMENTS (First embodiment)

Figure 1:
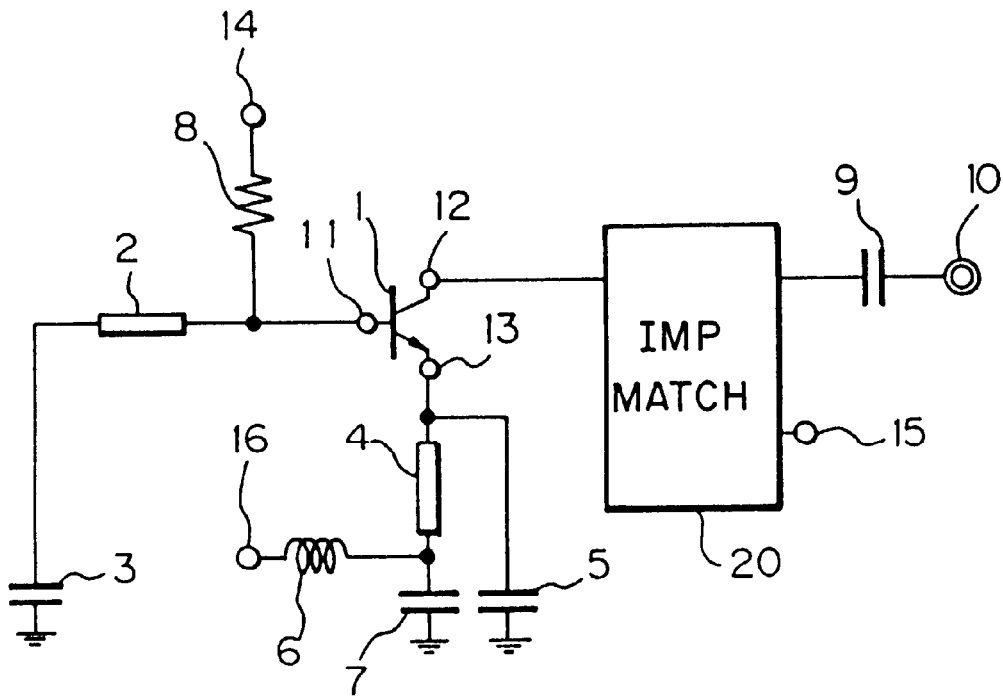
FIG. 1 is a circuit diagram of a first embodiment of a voltage controlled oscillator according to the present invention.

FIG. 1 shows a circuit diagram of a first embodiment of the present voltage controlled oscillator.

In the figure, the numeral 1 is a transistor for negative resistance generator. The transistor 1 has a base 11 coupled with a base voltage control terminal 14 which is a first control terminal through a resistor 8, and grounded through a transmission line 2 and a capacitor 3. The emitter 13 of the transistor 1 is connected to a transmission line 4 and a capacitor 5. The other end of the capacitor 5 is grounded. The other end of the transmission line 4 is grounded through a capacitor 7, and coupled with an emitter voltage control terminal 16 which operates as a second control terminal through an inductor 6.

It should be noted that a positive feedback circuit is provided between the base and the emitter of the transistor 1.

A collector 12 of the transistor 1 is through an impedance matching circuit 20 coupled with a capacitor 9, which is coupled with an output terminal 10. Said impedance matching circuit 20 is also connected to a collector voltage supply terminal 15.

When collector voltage is applied to the collector voltage supply terminal 15, an oscillator is provided when a transmission line 2 is coupled with the base 11, since the base of the transistor 1 provides capacitive negative impedance. The base current flowing in the transistor 1 is controlled by voltages supplied to the base voltage control terminal 14 and the emitter voltage control terminal 16. The resistance $R_{be}$ between the base and the emitter of the transistor 1 operates as a varistor which depends upon base current, and operates equivalently as a variable capacitor in a positive feedback circuit so that the base provides variable capacitance negative impedance to provide control of oscillation frequency. Thus, a voltage controlled oscillator is provided. The base current is controlled either by controlling both voltages at the base voltage control terminal 14 and the emitter voltage control terminal 16, or fixing one of them and controlling the other.

The operation principle of the circuit in FIG. 1 is now described.

Figure 20:
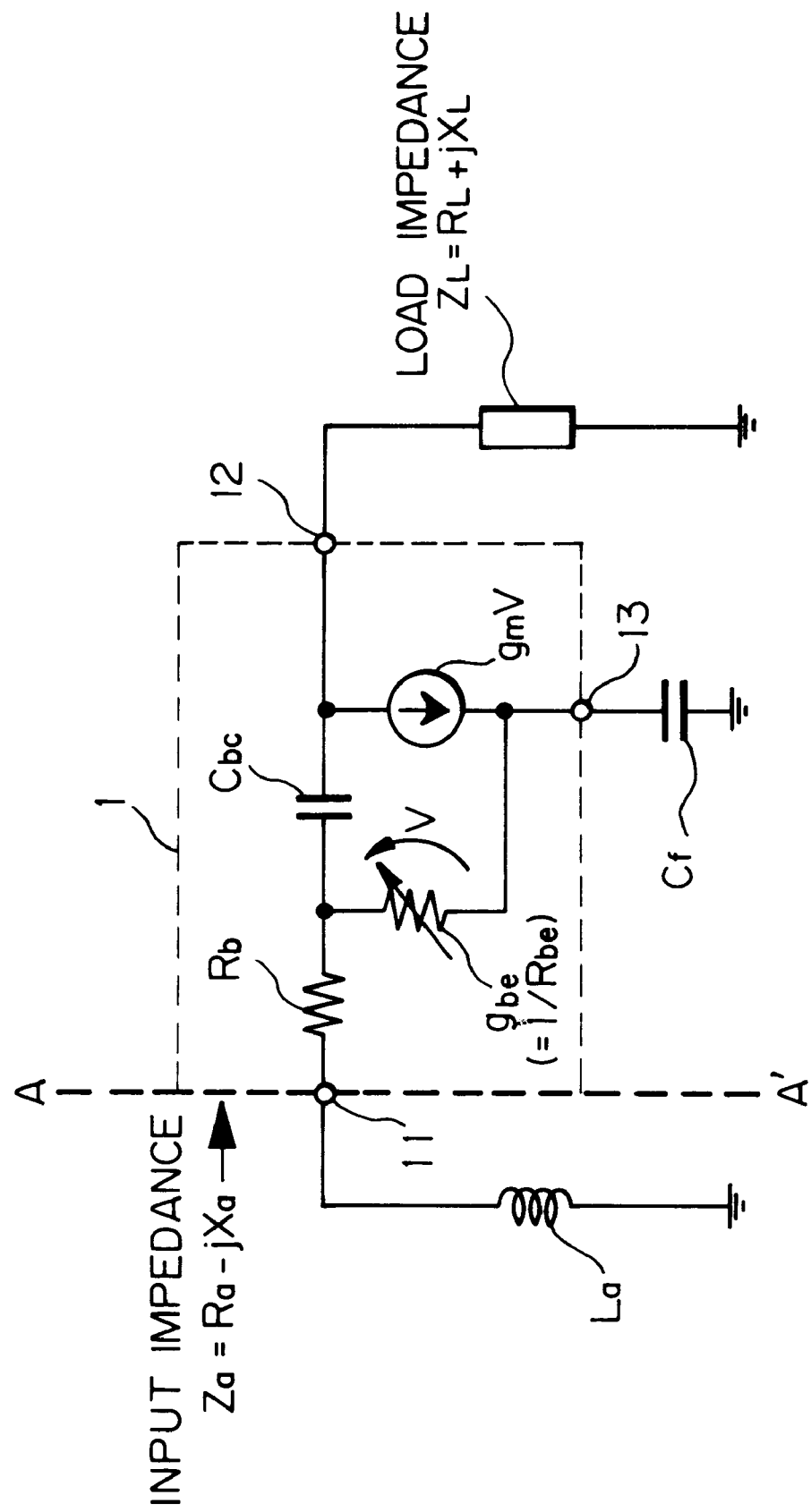
FIG. 20 is a simplified equivalent circuit of a first embodiment of a voltage controlled oscillator according to the present invention.

FIG. 20 shows a simplified equivalent circuit of the circuit of FIG. 1. In FIG. 20, the symbol $g_{be}$ is conductance between a base and an emitter (it is inverse of resistance $R_{be}$ between a base and an emitter), $C_{bc}$ is capacitance between a base and a collector, $R_b$ is a base resistance, $g_m$ is mutual conductance, $L_a$ is an inductance connected to a base, $C_f$ is a capacitance connected to an emitter, $Z_L$ is a load impedance connected to a collector.

Y parameter of a transistor 1 in common emitter configuration is shown in the following equation (1).

$$\begin{pmatrix} y_{11} & y_{12} \\ y_{21} & y_{22} \end{pmatrix} = \begin{pmatrix} \dfrac{g_{be} + j\omega C_{bc}}{1 + R_b(g_{be} + j\omega C_{bc})} & \dfrac{-j\omega C_{bc}}{1 + R_b(g_{be} + j\omega C_{bc})} \\ \dfrac{g_m - j\omega C_{bc}}{1 + R_b(g_{be} + j\omega C_{bc})} & \dfrac{j\omega C_{bc}\{1 + R_b(g_{be} + g_m)\}}{1 + R_b(g_{be} + j\omega C_{bc})} \end{pmatrix} \quad (1)$$

When Y matrix in the equation (1) is converted to Z parameter, then, an input impedance $Z_a$ viewing from a base is shown in the equation (2), where capacitance $C_f$ is neglected.

$$Z_a = \dfrac{g_m\{g_{be} + \omega C_{bc} X_L(g_{be} + g_m)\} + \omega^2 C_{be}^2 \{R_L(g_{be} + g_m) - 1\} - \{1 + R_b(g_{be} + g_m)\}\delta}{(g_{be} + g_m)\delta} - $$

$$j\dfrac{\omega C_{bc}(g_m R_L - \omega C_{bc} X_L - 1)}{\delta}$$

$$\delta = \{g_b + \omega C_{bc} X_L(g_{be} + g_m)\}^2 + \omega^2 C_{bc}^2\{R_L(g_{be} + g_m) - 1\}^2$$

When conductance $g_{be}$ between a base and an emitter in the equation (2) is noted, the equation (3) is obtained.

$$Z_a = R_a - jX_a \quad (3)$$

$$R_a \propto \dfrac{a_1 g_{be}^3 + a_2 g_{be}^2 + a_3 g_{be} + a_4}{(g_{be} + g_m)(b_1 g_{be}^2 + b_2 g_{be} + b_3)}$$

$$X_a \propto \dfrac{C_1}{b_1 g_{be}^2 + b_2 g_{be} + b_3}$$

where $a_1, a_2, a_3, a_4, b_1, b_2, b_3$, and $c_1$ are a constant. It should be noted in the equation (3) that imaginary part $X_a$ of input impedance $Z_a$ can vary in larger range than base-emitter conductance $g_{be}$. As the base-emitter resistance $R_{be}$ (base-emitter conductance) operates equivalently as variable capacitance, oscillation frequency is controllable.

Figure 21:
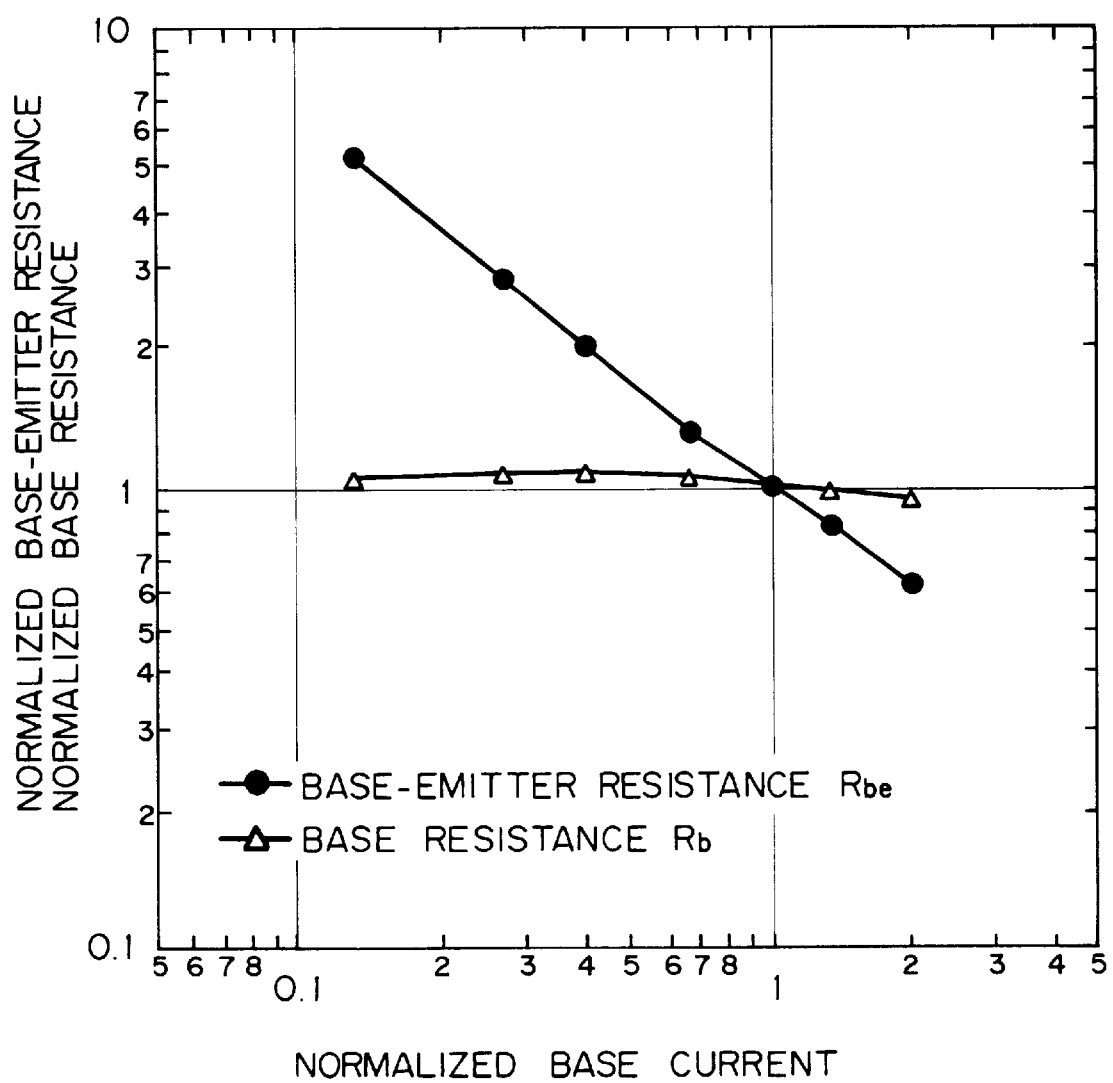
FIG. 21 shows relations between normalized base current, and normalized base-emitter resistance and normalized base resistance, of a silicon bipolar transistor (SSTIC)

FIG. 21 shows relationship between base current, and base-emitter resistance $R_{be}$, and base resistance $R_b$ of a bipolar transistor, wherein an SSTIC bipolar transistor is tested, and as current is normalized by the current used, the value in FIG. 21 is general and is independent from size of a transistor. It is noted in FIG. 21 that base resistance $R_b$ of a transistor is constant, but base-emitter resistance $R_{be}$ changes according to base current, and operates as a varistor with the control ratio 1:10 or higher.

Figure 26:
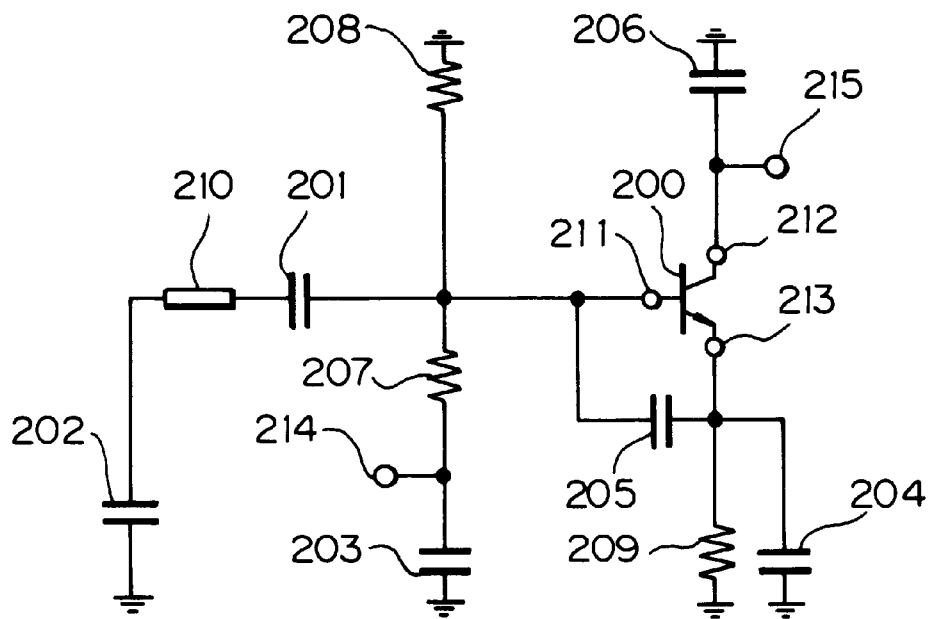
FIG. 26 is a voltage controlled oscillator of a second prior art.
Figure 27:
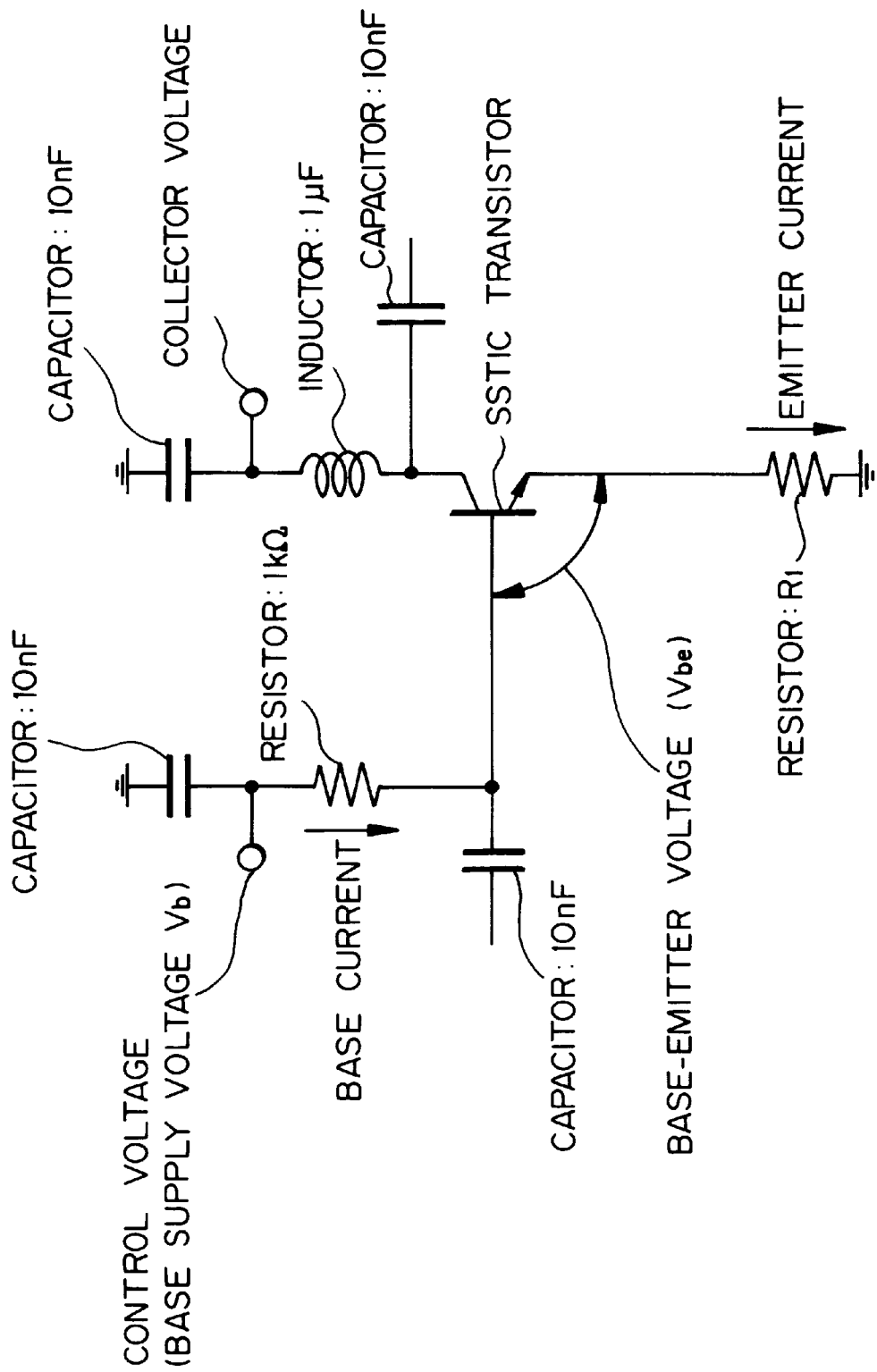
FIG. 27 is an equivalent circuit for analyzing D.C. operation in the second prior art using a silicon bipolar transistor (SSTIC)
Figure 28:
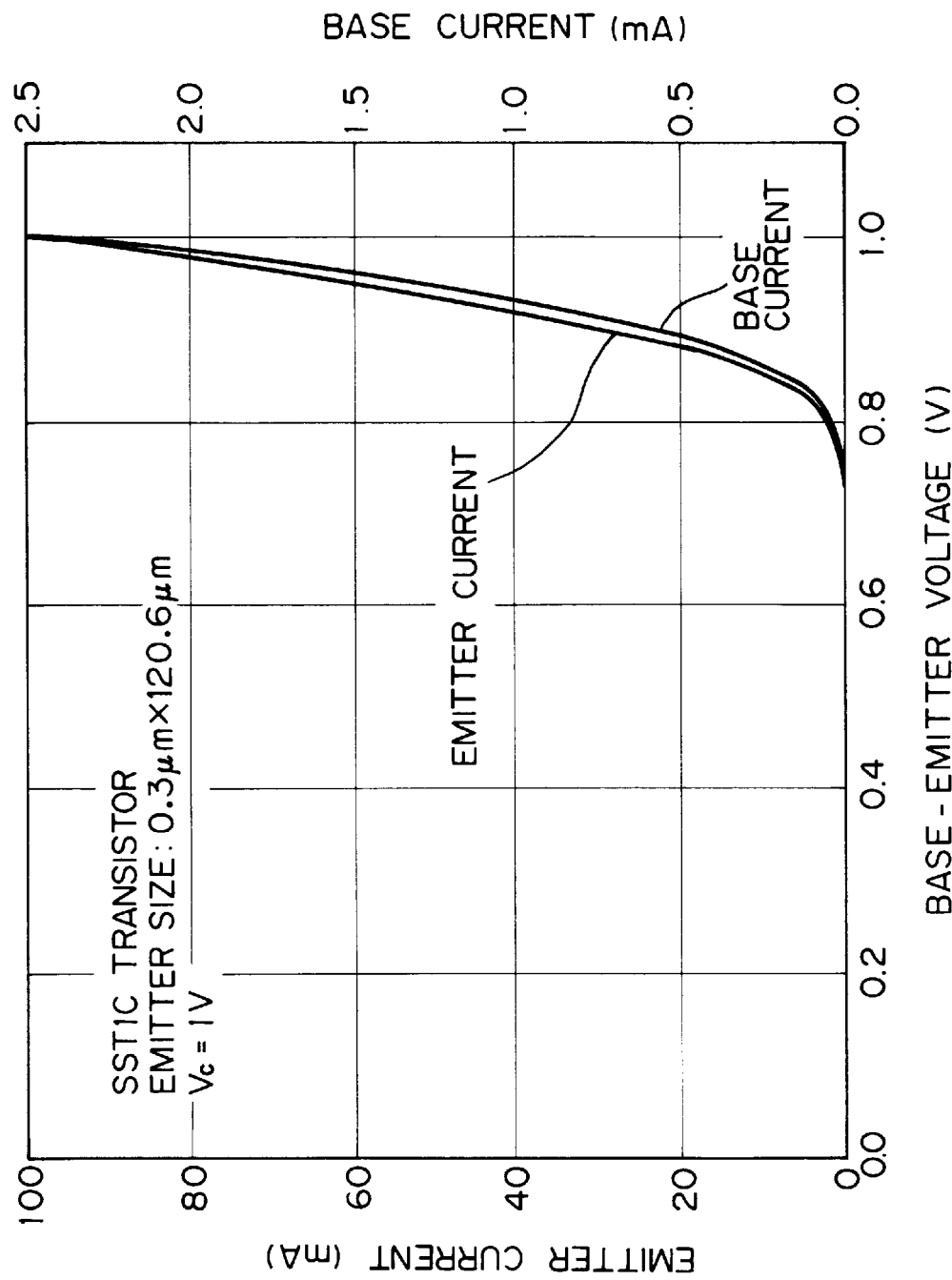
FIG. 28 shows relations between base-emitter voltage and emitter current of a silicon bipolar transistor (SSTIC)
Figure 29:
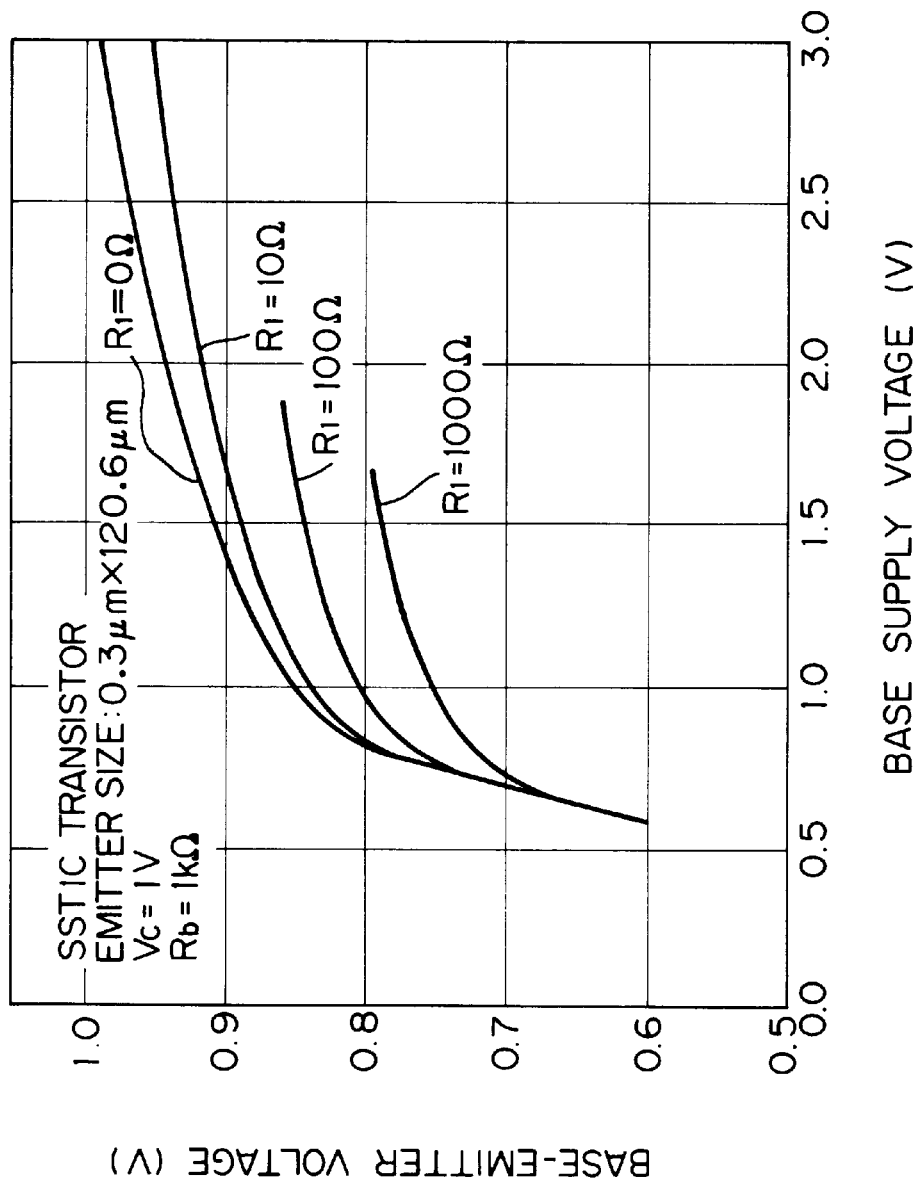
FIG. 29 shows calculated relations between base supply voltage and base-emitter voltage calculated by using the circuit of FIG. 27.

As described above, according to the first embodiment of the present invention, base current is controlled by the base-emitter voltage with large control range, and thus, the equivalent capacitive reactance in feedback circuit can be controlled with large range. Therefore, wider frequency control is possible than a prior art which uses a varactor. Further, as voltage applied to an emitter is supplied through an inductor, it does not depend upon emitter current, and the emitter voltage can be fixed to constant. Therefore, base-emitter voltage which controls base current is controlled arbitrary. Thus, base current is dynamically varied, the control ratio of base-emitter resistance $R_{be}$ may be larger than that of the prior voltage controlled oscillator of FIG. 26.

Figure 25:
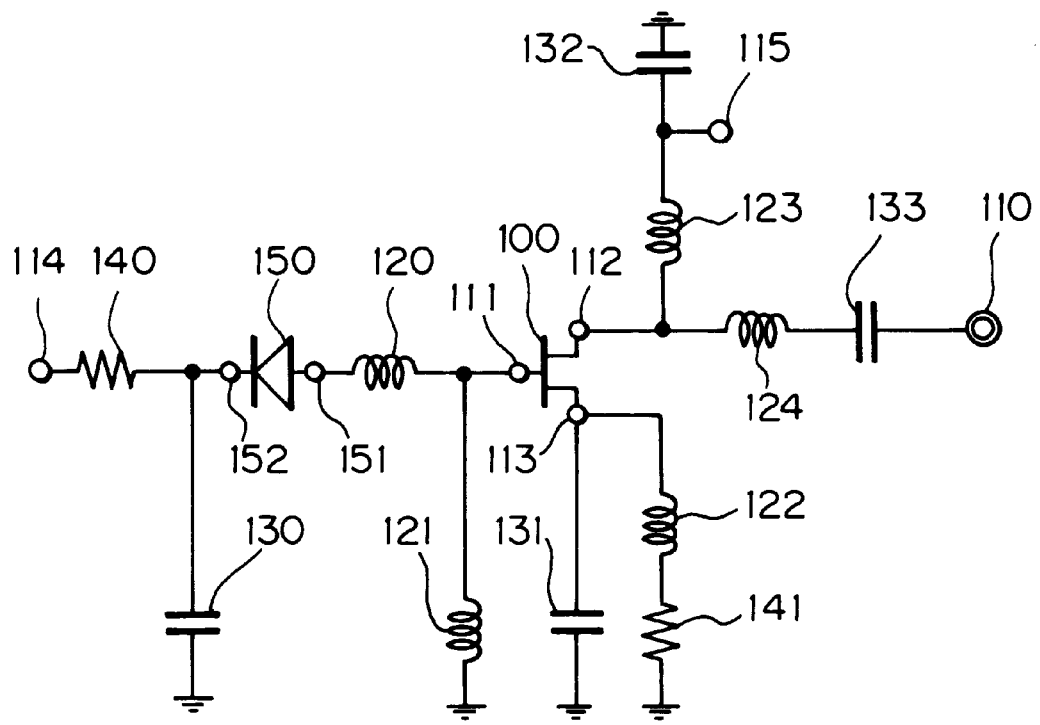
FIG. 25 is a voltage controlled oscillator of a first prior art.

Further, as the circuit has only one active element, the structure is simple and economical, the producing yield rate may be twice as large as that of the prior art of FIG. 25 when the circuit is produced in a monolithic integrated circuit.

Further, the phase noise of a voltage controlled oscillator is mainly generated by lower frequency noise which is up-converted close to oscillation frequency through an active device for negative resistance generator and variable reactance devices with non-linear characteristics (a varactor in a prior art). In that case, the present invention provides variable inductance by varistor characteristics of a transistor in an oscillation circuit, and therefore, the present invention provides lower phase noise than a prior art of FIG. 25, since active devices, which offers non-linear characteristic are removed except a transistor for negative resistance generator.

When a bipolar transistor is produced on a silicon substrate, it is excellent in 1/f noise, and the lower phase noise oscillator is obtained.

Since base current increases exponentially for base-emitter voltage, oscillation frequency change rapidly, however, the present invention provides slow or soft change of oscillation frequency by the presence of the resistor 8 which softens the change of the voltage of the base terminal by voltage drop effect by the current in the resistor 8. Thus, a voltage controlled oscillator with excellent control is obtained. As a modification, an inductor 6 may be replaced by a transmission line, and a transmission lines 2 and 4 may be replaced by an inductor.

(Second embodiment)

Figure 2:
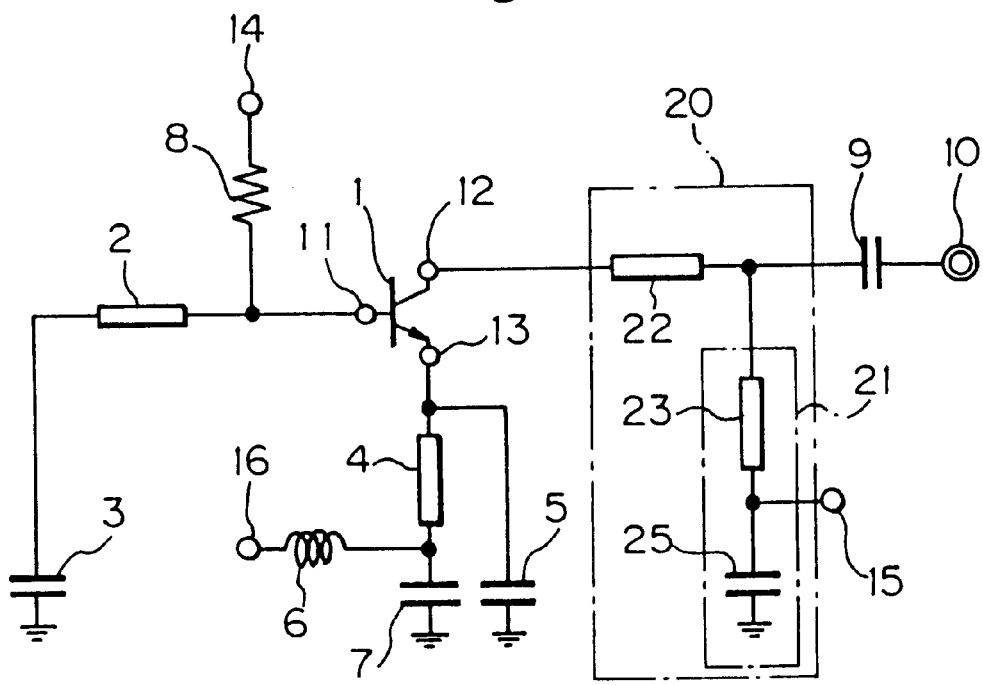
FIG. 2 is a circuit diagram of a second embodiment of a voltage controlled oscillator according to the present invention.

FIG. 2 shows a circuit diagram of the second embodiment of the voltage controlled oscillator according to the present invention. The same numerals in FIG. 2 show the same members as those in FIG. 1.

In FIG. 2, the numeral 1 is a transistor for negative resistance generator. The transistor 1 has a base 11 coupled with a base voltage control terminal 14 through a resistor 8, and grounded through a series circuit of a transmission line 2 and a capacitor 3. An emitter 13 of the transistor 1 is coupled to a transmission line 4 and a capacitor 5. The other end of the capacitor 5 is grounded, and the other end of the transmission line 4 is grounded through a capacitor 7 and coupled with an emitter voltage control terminal 16 which operates as a second control terminal through an inductor 6.

It should be noted that a positive feedback circuit is provided between a base and an emitter of the transistor 1.

A collector 12 of the transistor 1 is coupled with a capacitor 9 through an impedance matching circuit 20, and the other end of the capacitor 9 is coupled with an output terminal 10. The impedance matching circuit 20 comprises a transmission line 22 and a short-circuited stub 21 having a transmission line 23 and a capacitor 25. The collector voltage supply terminal 15 is connected to a junction of said transmission line 23 and said capacitor 25. When collector voltage is applied to the collector voltage supply terminal 15, the base of the transistor 1 shows capacitive negative impedance, an oscillator is provided when a transmission line 2 is coupled with the base 11. The base current in the transistor 1 is controlled by the voltages at the base voltage control terminal 14 and the emitter voltage control terminal 16.

The base-emitter resistance $R_{be}$ of the transistor 1 functions as a varistor which depends upon base current, and operates equivalently as a variable capacitor in a positive feedback circuit, therefore, the base provides variable capacitive negative impedance, which provides change of frequency. Thus, a voltage controlled oscillator is provided. The base current may be controlled either by controlling both the voltages at the base voltage control terminal 14 and the emitter voltage control terminal 16, or fixing one of the voltages to constant level and controlling the other voltage.

The second embodiment provides the similar effect as that of the first embodiment.

The numerical examples for a 6 GHz band voltage controlled oscillator will be shown with the following parameters where the transistor 1 is calculated by using SPICE model.

Transistor 1; (SSTIC transistor with emitter size 0.3 $\mu$m×120.6 $\mu$m)
Capacitor 3; C=12 pF
Capacitor 5; C=8 pF
Capacitor 7; C=2.37 pF
Capacitor 9; C=2 pF
Capacitor 25; C=10 pF
Resistor 8; R=1000 Ω
Inductor 6; L=3 nH
Transmission line 2; Z=40 Ω, L=3.66 mm, $\epsilon_r$=2.9
Transmission line 4; Z=70 Ω, L=5.00 mm, $\epsilon_r$=2.8
Transmission line 22; Z=50 Ω, L=0.30 mm, $\epsilon_r$=2.8
Transmission line 23; Z=70 Ω, L=1.03 mm, $\epsilon_r$=2.8
where $\epsilon_r$ is effective dielectric constant.

Figure 22A:
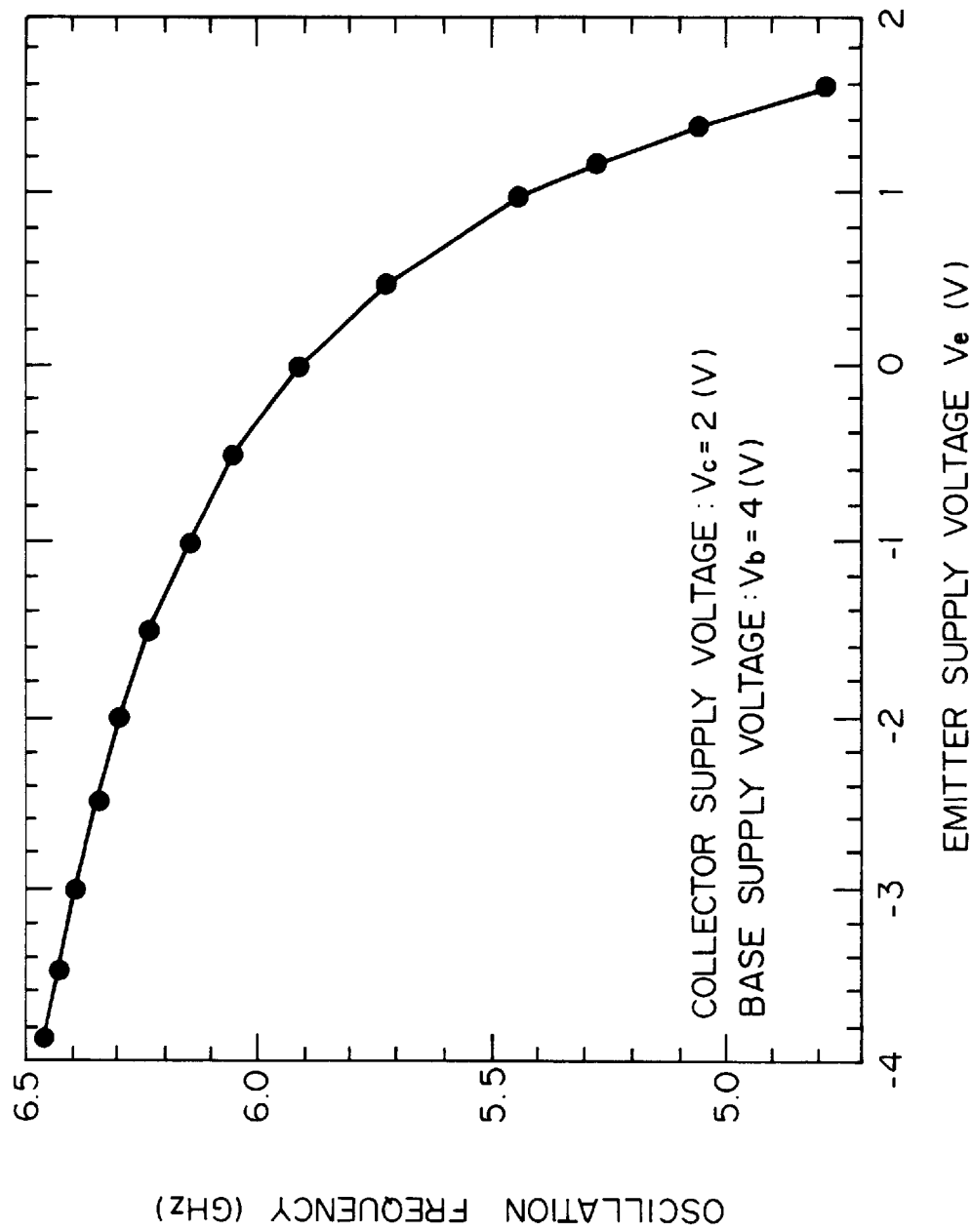
FIG. 22A shows calculated relations between emitter supply voltage and oscillation frequency of a 5 GHz band voltage controlled oscillator using a silicon bipolar transistor (SSTIC) in the second embodiment of the present invention.

FIG. 22A shows relations between voltage supplied from the emitter voltage control terminal 16 (horizontal axis) and the oscillation frequency (vertical axis), wherein voltage at a collector voltage supply terminal 15 is 2 V, and voltage at a base voltage control terminal 14 is 4 V.

FIG. 22B shows the relationship between the voltage at a base voltage control terminal 14 (horizontal axis) and the oscillation frequency (vertical axis) wherein voltage at a collector voltage supply terminal 15 is 2 V, and voltage at a base voltage control terminal 16 is 0 V.

It should be appreciated in FIGS. 22A and 22B that large frequency change is obtained either by controlling emitter supply voltage or base supply voltage. In particular, when emitter supply voltage is controlled, the oscillation frequency changes from 4.79 GHz to 6.46 GHz (33%) which is three times as large as frequency change range of a prior art. When base supply voltage is controlled, large oscillation frequency tuning range is obtained, and simultaneously, oscillation frequency changes linearly with control voltage, thus, the control of oscillation frequency is simplified.

(Third embodiment)

Figure 3:
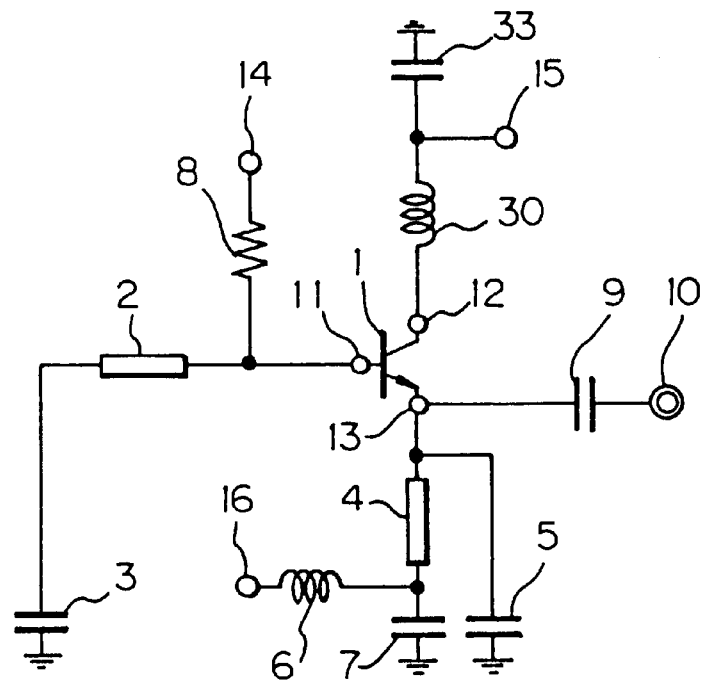
FIG. 3 is a circuit diagram of a third embodiment of a voltage controlled oscillator according to the present invention.

FIG. 3 shows a circuit diagram of third embodiment of a voltage controlled oscillator according to the present invention. The same numerals in FIG. 3 show the same members as those in FIG. 1.

In FIG. 3, the numeral 1 is a transistor for negative resistance generator. The transistor 1 has a base 11 coupled with a base voltage control terminal 14 which operates as a first control terminal through a resistor 8, and grounded through a series circuit of a transmission line 2 and a capacitor 3. The emitter 13 of the transistor 1 is coupled with a transmission line 4 and a capacitor 5. The other end of the capacitor 5 is grounded, and the other end of the transmission line 4 is grounded through a capacitor 7 and is coupled with an emitter voltage control terminal 16 which operates as a second control terminal through an inductor 6. The emitter 13 is further coupled with an output terminal 10 through a capacitor 9. A positive feedback circuit is provided between a base and an emitter of the transistor 1. The collector 12 of the transistor 1 is coupled with a collector voltage supply terminal 15 through an inductor 30 which is grounded through a capacitor 33.

When collector voltage is applied to the collector voltage supply terminal 15, the base of the transistor 1 shows capacitive negative impedance, and when a transmission line 2 is connected to a base 11, an oscillator is provided. The base current in the transistor 1 is controlled by the voltages at the base voltage control terminal 14 and at the emitter voltage control terminal 16. The base-emitter resistance $R_{be}$ functions as a varistor which depends upon base current, and operates equivalently as variable capacitor in a positive feedback circuit. Thus, the base shows variable capacitance negative impedance, thus, oscillation frequency varies, and a voltage controlled oscillator is provided. The base current may be controlled either by controlling both voltages at the base voltage control terminal 14 and at emitter voltage control terminal 16, or one of them being fixed to constant and the other being adjusted.

The third embodiment has the similar effect to that of the first embodiment. In the third embodiment, since a load (for instance 50 Ω) at an output terminal 10 is directly coupled with an emitter 13 through a capacitor 9, the load at the output terminal 10 may be designed as an element for providing negative resistance. Therefore, oscillation condition may be designed considering said load at an output side, and thus, the reflection from the output load may be improved, and no impedance matching circuit in outside is necessary. Further, as an impedance matching circuit is not necessary, size of the circuit becomes small considerably.

(Fourth embodiment)

Figure 4:
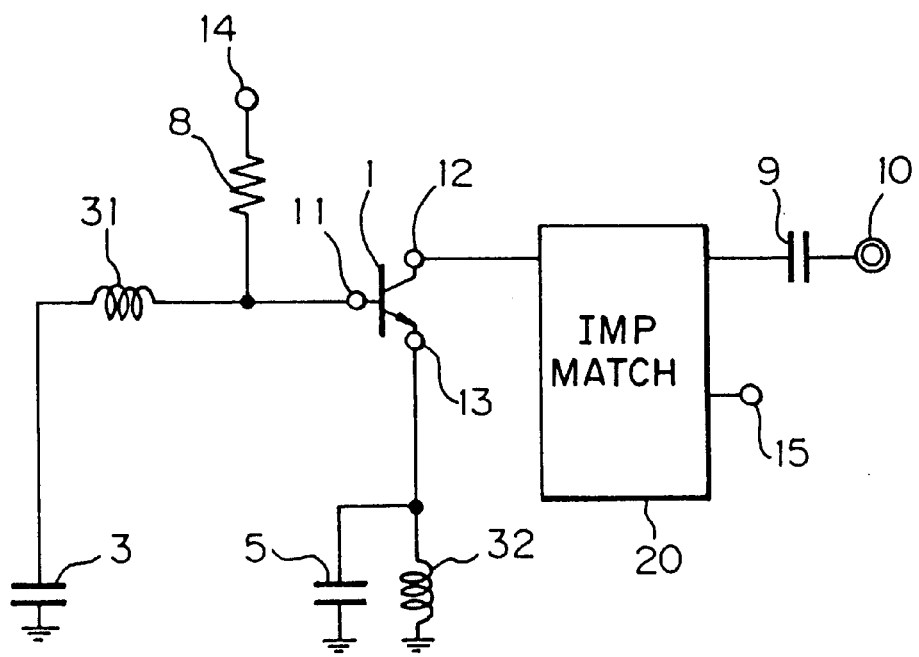
FIG. 4 is a circuit diagram of a fourth embodiment of a voltage controlled oscillator according to the present invention.

FIG. 4 shows a circuit diagram of fourth embodiment of the voltage controlled oscillator according to the present invention. The same numerals in FIG. 4 show the same members as those in FIG. 1.

In FIG. 4, the numeral 1 is a transistor for negative resistance generator. The transistor 1 has a base 11 coupled with a base voltage control terminal 14 which operates as a first control terminal through a resistor 8, and grounded through a series circuit of an inductor 31 and a capacitor 3. The emitter 13 of the transistor 1 is coupled with an inductor 32 and a capacitor both of which are grounded, so that a positive feedback circuit is provided between a base and an emitter of the transistor 1. The collector 12 of the transistor 1 is coupled with a capacitor 9 through an impedance matching circuit 20, and the other end of the capacitor 9 is connected to an output terminal 10. The impedance matching circuit 20 is also coupled with a collector voltage supply terminal 15.

When collector voltage is applied to the collector voltage supply terminal 15, the base of the transistor 1 shows capacitive negative impedance, and when an inductor 31 is connected to the base 11, an oscillator is provided. The base current in the transistor 1 is controlled by control voltage at the base voltage control terminal 14. The base-emitter resistance $R_{be}$ of the transistor 1 functions as a varistor which depends upon base current, and operates equivalently as variable capacitance in a positive feedback circuit, thus, the base shows variable capacitive negative impedance. Thus, the oscillation frequency changes, and a voltage controlled oscillator is provided.

The fourth embodiment has the similar effect to that of the first embodiment. In the fourth embodiment, the emitter of the transistor 1 is short-circuited to ground for D.C. current by the inductor 32. Therefore, the D.C. potential of the emitter is fixed to 0 V, thus, an emitter voltage control terminal is not necessary. Thus, a simple voltage controlled oscillator is obtained.

(Fifth embodiment)

Figure 5:
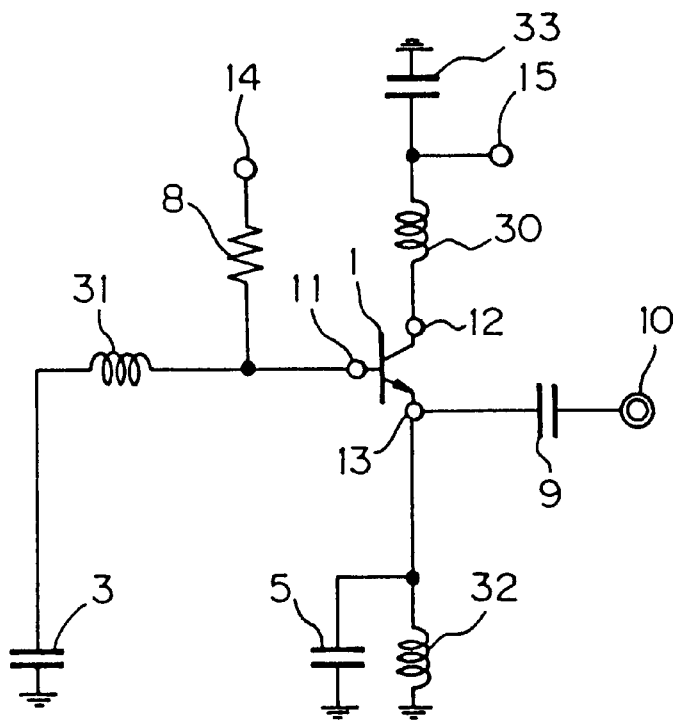
FIG. 5 is a circuit diagram of a fifth embodiment of a voltage controlled oscillator according to the present invention.

FIG. 5 shows fifth embodiment of a voltage controlled oscillator according to the present invention. The same numerals in FIG. 5 show the same members as those in FIG. 1.

In FIG. 5, the numeral 1 is a transistor for negative resistance generator. The transistor 1 has a base 11 coupled with a base voltage control terminal 14 which operates as a first control terminal through a resistor 8, and grounded through a series circuit of an inductor 31 and a capacitor 3. The emitter 13 is grounded through a parallel circuit of an inductor 32 and a capacitor 5. The emitter 13 is further coupled with an output terminal 10 through a capacitor 9. A positive feedback circuit is provided between the base and the emitter of the transistor 1. The collector 12 of the transistor 1 is coupled with a collector voltage supply voltage 15 through an inductor 30, which is grounded through a capacitor 33.

When collector voltage is applied to said collector voltage supply terminal 15, the base of the transistor 1 shows capacitive negative impedance, therefore, when an inductor 31 is connected to the base of the transistor, an oscillator is provided. The base current is controlled by the voltage supplied to the base voltage control terminal 14. The base-emitter resistance $R_{be}$ of the transistor 1 functions as a varistor which depends upon base current, and operates equivalently as variable capacitance in a positive feedback circuit. Therefore, the base shows variable capacitive negative impedance, and thus, the oscillation frequency varies. Thus, a voltage controlled oscillator is obtained.

The fifth embodiment has the similar effect to that of the first embodiment, and further, since the emitter of the transistor 1 is short-circuited to ground by the inductor 32 for D.C. voltage, and the D.C. potential of the emitter is fixed to 0 V, no emitter voltage control terminal is necessary. Thus, a simple voltage controlled oscillator is obtained.

(Sixth embodiment)

Figure 6:
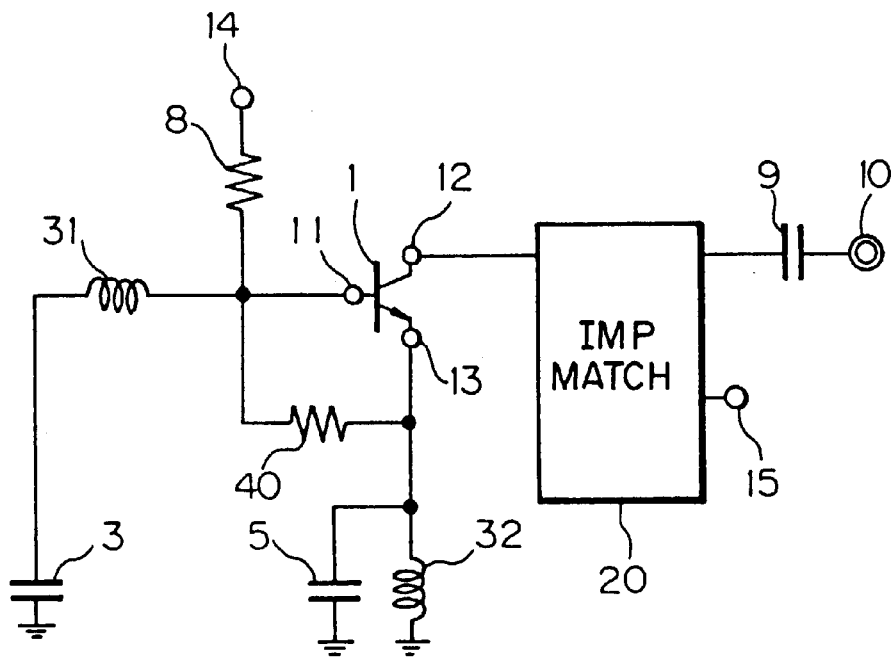
FIG. 6 is a circuit diagram of a sixth embodiment of a voltage controlled oscillator according to the present invention.

FIG. 6 shows sixth embodiment of a voltage controlled oscillator according to the present invention. The same numerals in FIG. 6 show the same members as those in FIG. 1.

In FIG. 6, the numeral 1 is a transistor for negative resistance generator. The transistor 1 has a base 11 coupled with a base voltage control terminal 14 which operates as a first control terminal through a resistor 8, and grounded through a series circuit of an inductor 31 and a capacitor 3. An emitter 13 is grounded through a parallel circuit of an inductor 32 and a capacitor 5, so that a positive feedback circuit is provided between a base and an emitter of the transistor 1. The base 11 and the emitter 13 are coupled together through a resistor 40. A collector 12 of the transistor 1 is coupled with an output terminal 10 through an impedance matching circuit 20 and a capacitor 9. The impedance matching circuit 20 has further a collector voltage supply terminal 15.

When collector voltage is supplied to the collector voltage supply terminal 15, the base of the transistor 1 shows capacitive negative impedance, an oscillator is provided when an inductor 31 is connected to the base 11. The voltage at the base voltage control terminal 14 controls base current in the transistor 1. The base-emitter resistance $R_{be}$ of the transistor 1 functions as a varistor which depends upon base current, and equivalently operates variable capacitance in a positive feedback circuit, and therefore, a base shows variable capacitive negative impedance, thus, oscillation frequency is controlled, and a variable frequency oscillator is provided.

The embodiment of FIG. 6 has similar advantage as that of FIG. 1. Further, the resistor 40 between the base and the emitter of the transistor 1 is coupled parallel with the base-emitter resistance $R_{be}$ so that it adjusts the range of the base-emitter resistance (varistor) which satisfies oscillation condition. When the resistance of the resistor 40 is small, the range of the varistor which satisfies oscillation condition shifts to the smaller value or small base current. Thus, as range of equivalent variable capacitance in a positive feedback circuit changes, it is possible to adjust frequency tuning range by the resistance of the resistor 40. Further, the presence of the resistor 40 between the base and the emitter of the transistor 1 stables the base-emitter voltage for D.C. voltage.

(Seventh embodiment)

Figure 7:
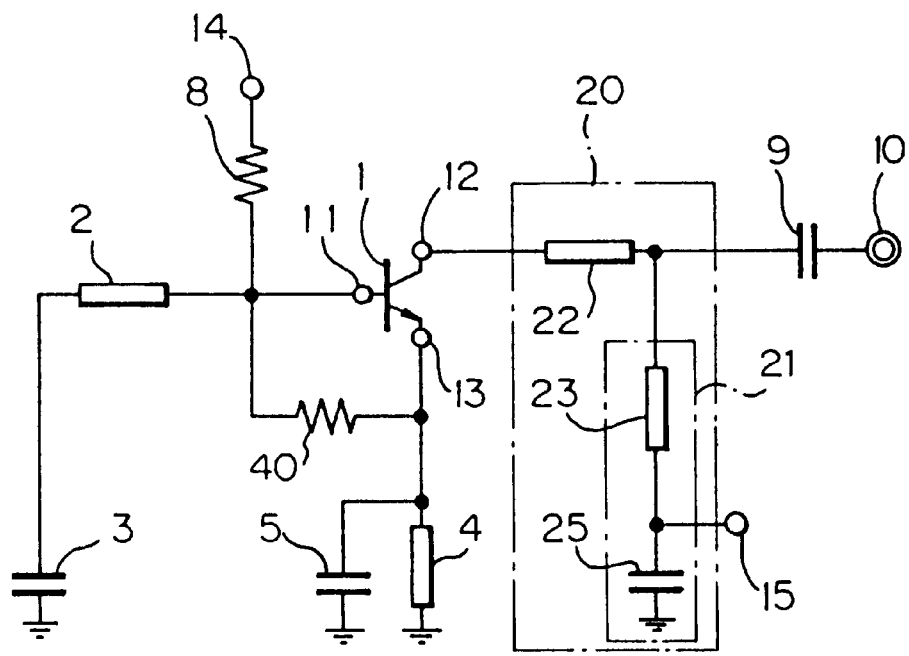
FIG. 7 is a circuit diagram of a seventh embodiment of a voltage controlled oscillator according to the present invention.

FIG. 7 shows seventh embodiment of the voltage controlled oscillator according to the present invention. The same reference numerals in FIG. 7 show the same members as those in FIG. 1.

In FIG. 7, the numeral 1 is a transistor for negative resistance generator. The transistor 1 has a base 11 coupled with a base voltage control terminal 14 which operates as a first control terminal through a resistor 8, and grounded through a series circuit of a transmission line 2 and a capacitor 3. The emitter 13 is grounded through a parallel circuit of a transmission line 4 and a capacitor 5 so that a positive feedback circuit is provided between a base and an emitter of the transistor 1. The base and the emitter are coupled together by the resistor 40. The collector 12 of the transistor 1 is coupled with an output terminal 10 through a series circuit of an impedance matching circuit 20 and a capacitor 9. The impedance matching circuit 20 comprises a transmission line 22 and a short-circuited stub 21 having a transmission line 23 and a capacitor 25. A collector voltage supply voltage 15 is coupled with a junction of the transmission line 23 and the capacitor 25.

When collector voltage is applied to said collector voltage supply terminal 15, the base of the transistor 1 shows capacitive negative impedance, and an oscillator is provided by coupling a transmission line 2 with the base 11. The base current in the transistor 1 is controlled by the voltage supplied to the base voltage control terminal 14. The base-emitter resistance $R_{be}$ of the transistor 1 functions as a varistor which depends upon the base current, and operates equivalently as variable capacitance in a positive feedback circuit, thus, the base shows variable capacitive negative impedance so that oscillation frequency is adjusted. Thus, a voltage controlled oscillator is provided.

The seventh embodiment has the similar advantage to that of the sixth embodiment.

Figure 23:
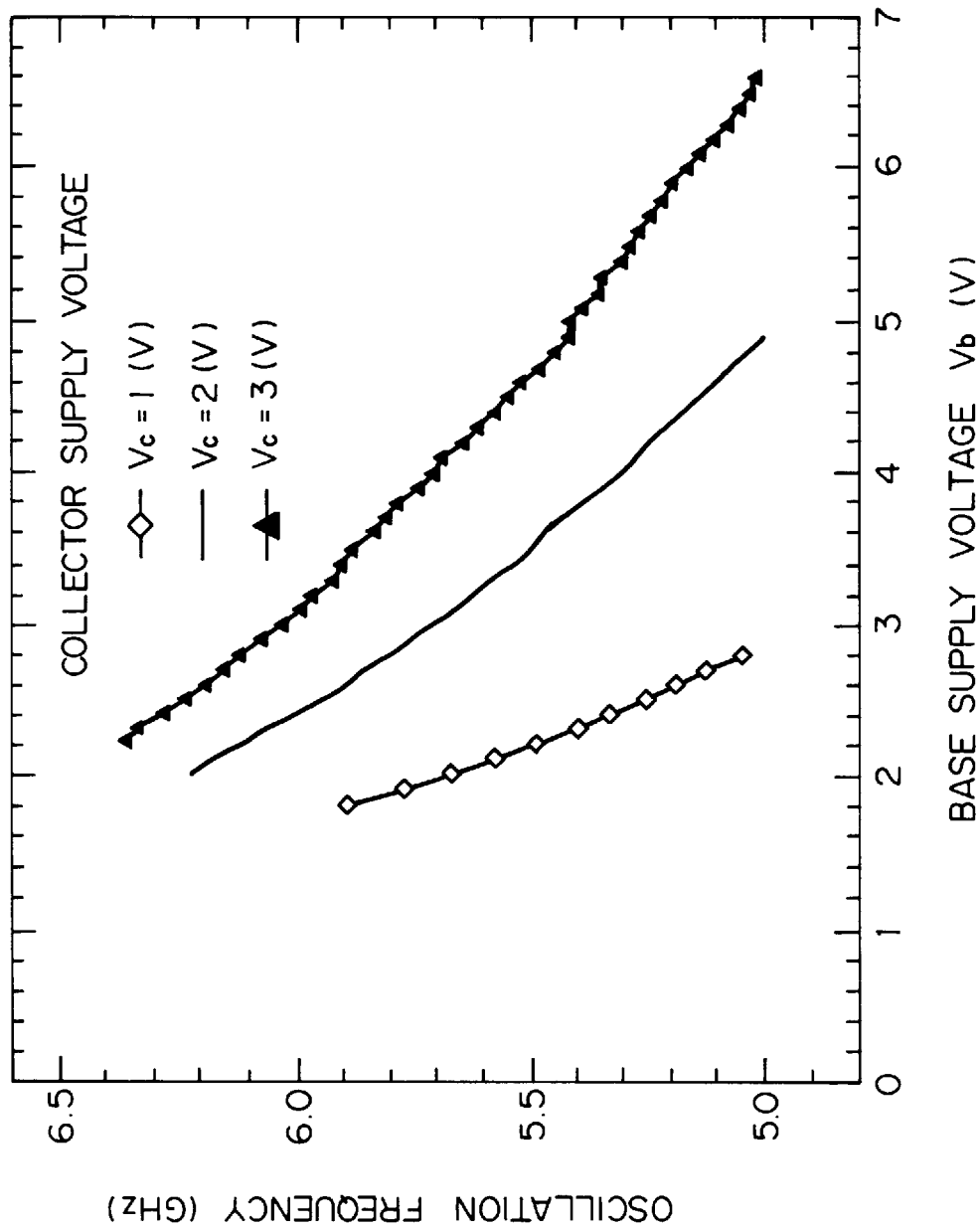
FIG. 23 shows measured relations between base supply voltage and oscillation frequency of a 5 GHz band voltage controlled oscillator using a silicon bipolar transistor (SSTIC) in the seventh embodiment of the present invention.

The experimental embodiment is shown below, and the result is shown in FIG. 23.

Transistor 1; SSTIC transistor with emitter size 0.3 μm×120.6 μm

Capacitor 3; C=12 pF

Capacitor 5; C=2.7 pF

Capacitor 7; C=0.5 pF

Capacitor 26; C=10 pF

Resistor 8; R=1000 Ω

Resistor 9; R=1000 Ω

Transmission line 2; Z=40 Ω, L=3.66 mm, $\epsilon_r$=2.9

Transmission line 4; Z=70 Ω, L=3.00 mm, $\epsilon_r$=2.8

Transmission line 23; Z=70 Ω, L=1.03 mm, $\epsilon_r$=2.8 where $\epsilon_r$ is effective dielectric constant.

As shown in FIG. 23, a voltage controlled oscillator of the seventh embodiment experimentally provides wide frequency tuning range (33%) extending from 4.02 GHz to 5.35 GHz when a collector voltage supply terminal 15 receives 3 Volts. That tuning range is three times as wide as that of a prior voltage controlled oscillator which uses a varactor diode. Further, as shown in simulation of FIG. 22B, oscillation frequency change is linear to control voltage supplied to a base voltage control terminal 14.

(Eighth embodiment)

Figure 8:
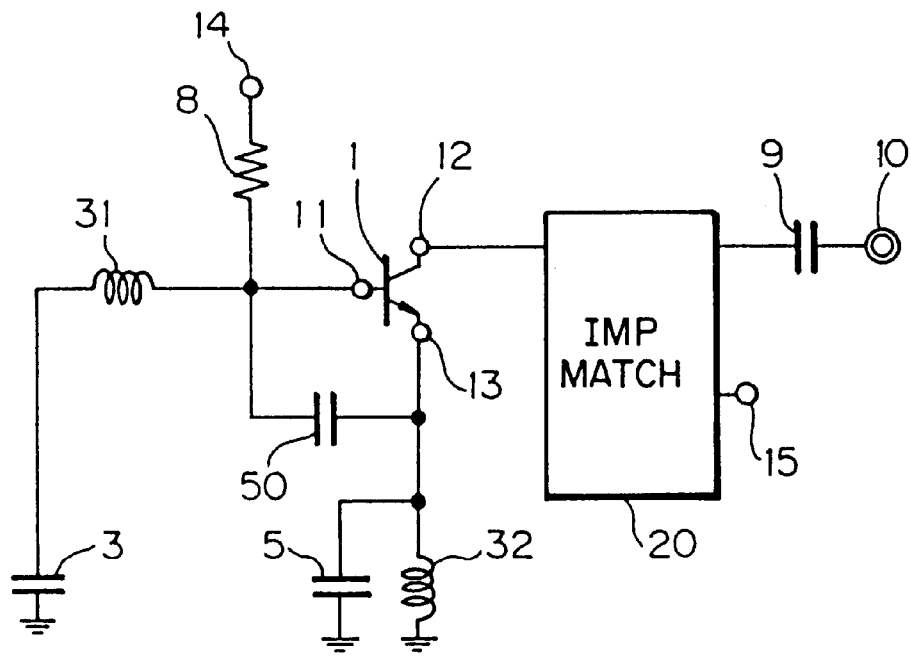
FIG. 8 is a circuit diagram of an eighth embodiment of a voltage controlled oscillator according to the present invention.

FIG. 8 shows eighth embodiment of a voltage controlled oscillator according to the present invention. The same numerals in FIG. 8 show the same members as those in FIG. 1.

In FIG. 8, the numeral 1 is a transistor for negative resistance generator. The transistor 1 has a base 11 coupled with a base voltage control terminal 14 which operates as a first control terminal through a resistor 8, and grounded through a series circuit of an inductor 31 and a capacitor 3. An emitter 13 is grounded through a parallel circuit of an inductor 32 and a capacitor 5, so that a positive feedback circuit is provided between the base and the emitter of the transistor 1. The base 11 is coupled with the emitter 13 through a capacitor 50. A collector 12 of the transistor 1 is coupled with an output terminal 10 through an impedance matching circuit 20 and a capacitor 9. The impedance matching circuit 20 has further a collector voltage supply terminal 15.

When collector voltage is applied to the collector voltage supply terminal 15, the base of the transistor 1 shows capacitive negative impedance, an oscillator is obtained when an inductor 31 is coupled with the base 11. The base current of the transistor 1 is controlled by the voltage supplied to the base voltage control terminal 14.

The base-emitter resistance $R_{be}$ of the transistor 1 functions as a varistor which depends upon base current, and operates equivalently as variable capacitance in a positive feedback circuit, thus, the base shows variable capacitive negative impedance so that oscillation frequency changes. Thus, a voltage controlled oscillator is obtained.

The eighth embodiment has the similar advantage to that of the first embodiment. Further, the capacitor 50 between the base and the emitter of the transistor 1 improves the value Q of a resonator, and thus, phase noise in an output signal is lowered.

(Ninth embodiment)

Figure 9:
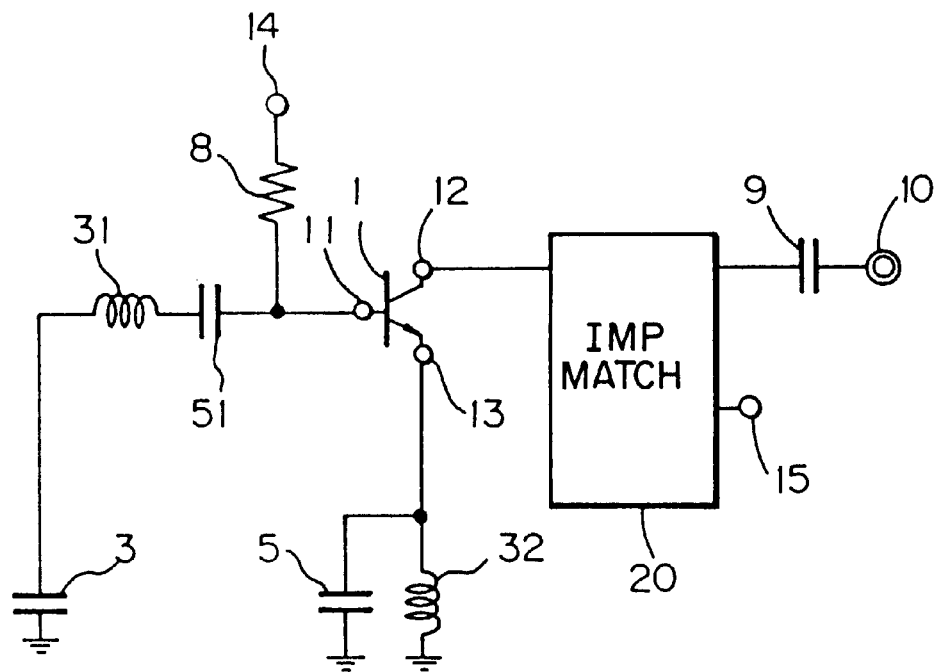
FIG. 9 is a circuit diagram of a ninth embodiment of a voltage controlled oscillator according to the present invention.

FIG. 9 shows ninth embodiment of a voltage controlled oscillator according to the present invention. The same numerals in FIG. 9 show the same members as those in FIG. 1.

In FIG. 9, the numeral 1 is a transistor for negative resistance generator. The transistor 1 has a base 11 coupled with a base voltage control terminal 14 through a resistor 8, and grounded through a series circuit of a capacitor 51, an inductor 31 and a capacitor 3. An emitter 13 is grounded through a parallel circuit of an inductor 32 and a capacitor 5 so that a positive feedback circuit is provided between the base and the emitter of the transistor 1. A collector 12 is coupled with an output terminal 10 through an impedance matching circuit 20 and a capacitor 9. The impedance matching circuit 20 has further a collector voltage supply terminal 15.

When collector voltage is applied to the collector voltage supply terminal 15, the base of the transistor 1 shows capacitive negative impedance, thus, an oscillator is provided when an inductor 31 is coupled with the base 11. The base current of the transistor 1 is adjusted by the voltage supplied to the base voltage control terminal 14. The base-emitter resistance $R_{be}$ of the transistor 1 functions as a varistor which depends upon base current, and operates equivalently as variable capacitance in a positive feedback circuit, thus, the base shows variable capacitive negative impedance so that oscillation frequency is changed. Thus, a voltage controlled oscillator is provided.

The ninth embodiment has the similar advantage as that of the first embodiment. Further, as the capacitor 51 provides loose coupling between a resonator of an inductor 31 and a capacitor 3 with a transistor (1), the value Q of the resonator is increased so that phase noise in an output signal is improved.

(Tenth embodiment)

Figure 10:
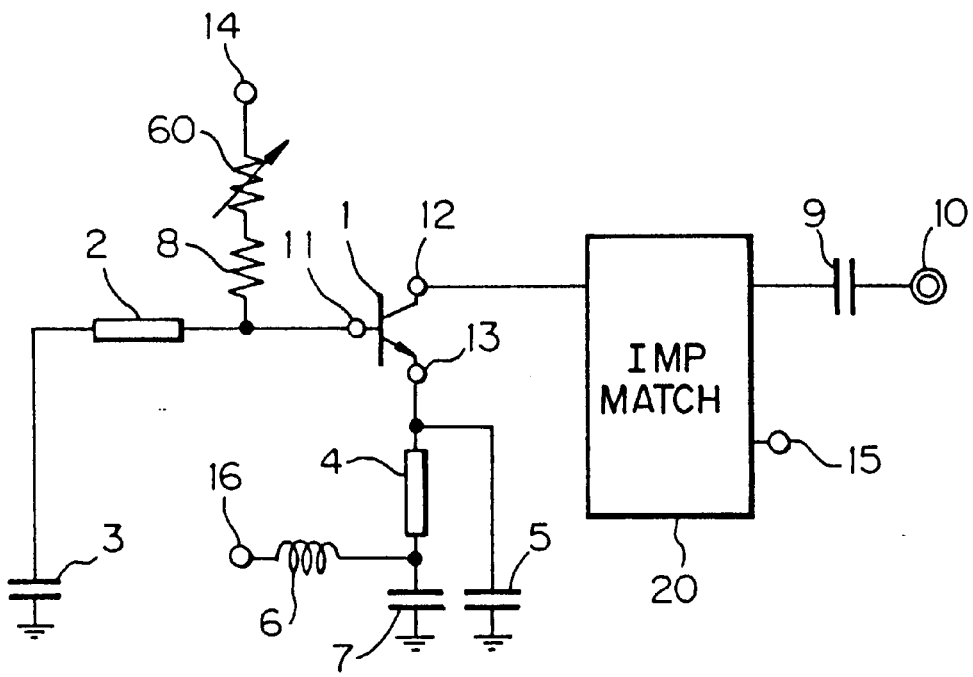
FIG. 10 is a circuit diagram of a tenth embodiment of a voltage controlled oscillator according to the present invention.

FIG. 10 shows tenth embodiment of a voltage controlled oscillator according to the present invention. The same numerals as those in FIG. 1 show the same members.

In FIG. 10, the numeral 1 is a transistor for negative resistance generator. The transistor 1 has a base 11 coupled with a base voltage control terminal 14 which operates as a first control terminal through a series circuit of a resistor 8 and a varistor 60, and is grounded through a series circuit of a transmission line 2 and a capacitor 3. An emitter 13 is connected to a transmission line 4 and a capacitor 5 which is then grounded. The other end of the transmission line 4 is connected to an inductor 6 and a capacitor 7 which is then grounded. The other end of the inductor 6 is connected an emitter voltage control terminal 16 which operates as a second control terminal. A positive feedback circuit is provided between the base and the emitter of the transistor 1. A collector 12 of the transistor 1 is coupled with an output terminal 10 through an impedance matching circuit 20 and a capacitor 9. The impedance matching circuit 20 has further a collector voltage supply terminal 15.

When collector voltage is applied to the collector voltage supply terminal 15, the base of the transistor 1 shows capacitive negative impedance, an oscillator is provided when a transmission line 2 is connected to the base 11. The base current of the transistor 1 is adjusted by the voltages supplied to the base voltage control terminal 14 and the emitter voltage control terminal 16. The base-emitter resistance $R_{be}$ of the transistor 1 functions as a varistor which depends upon base current, and operates equivalently as variable capacitance in a positive feedback circuit. Therefore, the base shows variable capacitive negative impedance so that oscillation frequency is changed. Thus, a voltage controlled oscillator is obtained.

The base current is controlled either by changing simultaneously both voltages applied to the base voltage control terminal 14 and the emitter voltage control terminal 16, or fixing one of them and changing the other.

The tenth embodiment has the similar advantage to that of the first embodiment. Further, the presence of a varistor 60 changes the whole resistance between the base and the base voltage control terminal 14, and the effect of the voltage at the terminal 14 is modified. Thus, the tuning sensitivity of the control voltage applied to the base voltage control terminal 14 to the oscillation frequency is modified.

Figure 24:
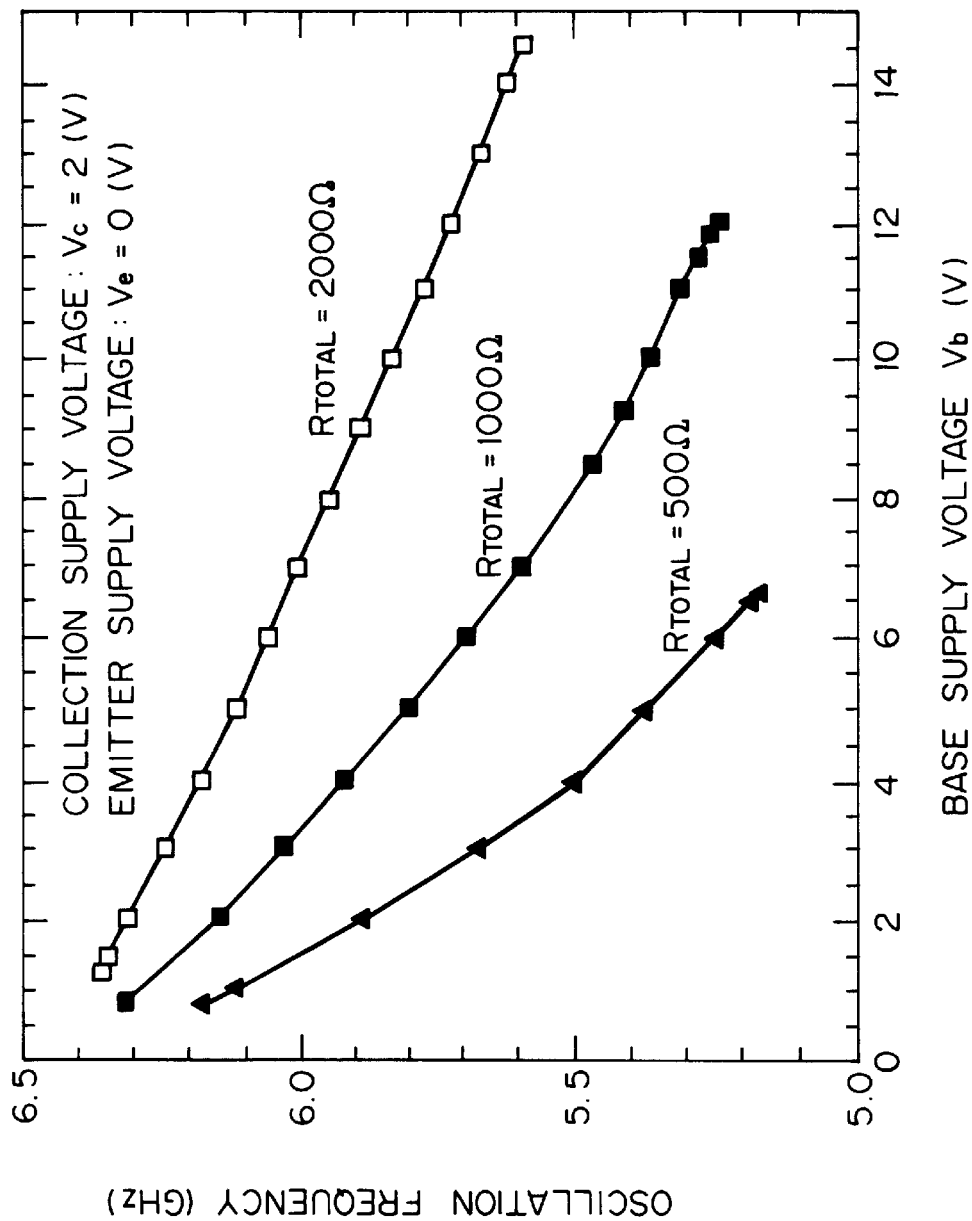
FIG. 24 shows relations between base supply voltage and oscillation frequency of a 5 GHz band voltage controlled oscillator using a silicon bipolar transistor (SSTIC) in the tenth embodiment of the present invention.

FIG. 24 shows the relationship between the control voltage applied to the base voltage control terminal 14 and the oscillation frequency where the sum of the resistance of the resistor 8 and the resistance of the varistor 60 is $R_{TOTAL}$ and the parameters are the same as those in the second embodiment. When $R_{TOTAL}$ is large, the tuning sensitivity is controlled with no deterioration of linearity. Further, When the voltage at the base voltage control terminal 14 is fixed, the oscillation frequency is changed by controlling the varistor 60.

(Eleventh embodiment)

Figure 11:
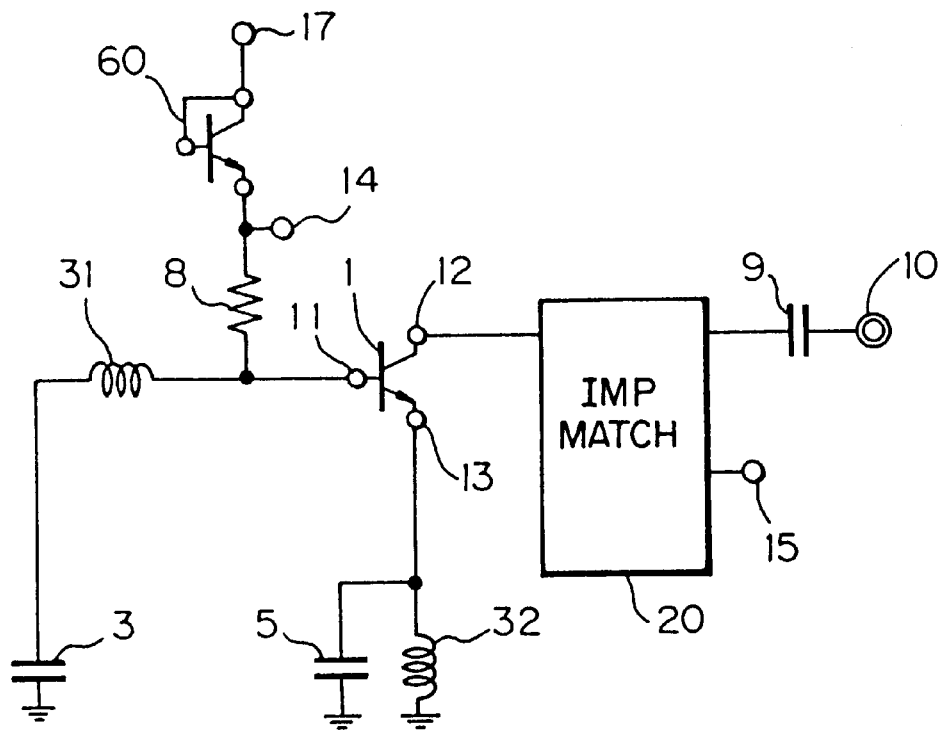
FIG. 11 is a circuit diagram of an eleventh embodiment of a voltage controlled oscillator according to the present invention.

FIG. 11 shows eleventh embodiment of a voltage controlled oscillator according to the present invention. In FIG. 11, the same numerals as those in FIG. 1 show the same members.

In FIG. 11, the numeral 1 is a transistor for negative resistance generator. The transistor 1 has a base 11 coupled with a base voltage control terminal 14 which operates as a first control terminal through a resistor 8, and grounded with a series circuit of an inductor 31 and a capacitor 3. The base voltage control terminal 14 is connected to a varistor 60 which has a transistor with a base coupled with a collector and a varistor control terminal 17, and an emitter coupled with the base voltage control terminal 14 so that the varistor 60 is controlled by the potential difference between the potential at the base voltage control terminal 14 and the potential at the varistor control terminal 17. An emitter 13 of the transistor 1 is grounded through a parallel circuit of an inductor 32 and a capacitor 5 so that a positive feedback circuit is provided between a base and an emitter of the transistor 1. A collector 12 of the transistor 1 is coupled with an output terminal 10 through an impedance matching circuit 20 and a capacitor 9. The impedance matching circuit 20 has further a collector voltage supply terminal 15.

When collector voltage is supplied to the collector voltage supply terminal 15, the base of the transistor 1 shows capacitive negative impedance, thus, an oscillator is provided when an inductor 31 is connected to the base 11. The base current of the transistor 1 is controlled by the voltage at the base voltage control terminal 14. The base-emitter resistance $R_{be}$ of the transistor 1 functions as a varistor which depends upon base current, and operates equivalently as variable capacitance in a positive feedback circuit. Thus, the base shows variable capacitive negative impedance, thus, oscillation frequency changes, and a voltage controlled oscillator is obtained.

The eleventh embodiment has the similar advantage as that of tenth embodiment. As a modification, instead of coupling emitter of the transistor for varistor 60 with a base voltage control terminal 14 and a base with a varistor control terminal 17, it is possible to couple an emitter with a varistor control terminal 17, and a base with a base voltage control terminal 14.

(Twelfth embodiment)

Figure 12A:
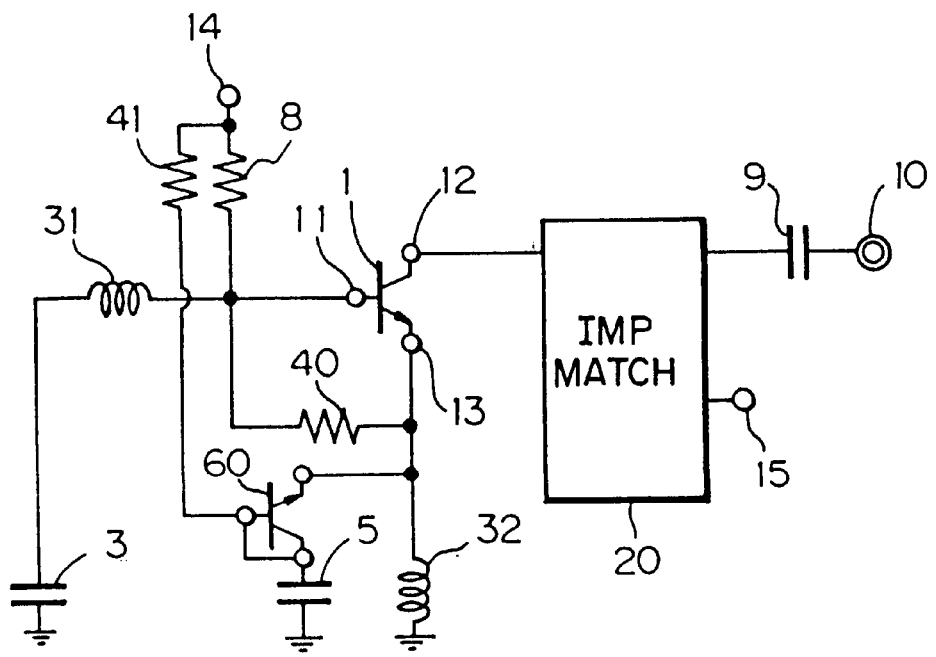
FIG. 12A is a circuit diagram of a twelfth embodiment of a voltage controlled oscillator according to the present invention.

FIG. 12A shows twelfth embodiment of a voltage controlled oscillator according to the present invention.

In FIG. 12A, the same numerals as those in FIG. 1 show the same members.

In FIG. 12A, the numeral 1 is a transistor for negative resistance generator. The transistor 1 has a base 11 coupled with a base voltage control terminal 14 through a resistor 8, and grounded through a series circuit of an inductor 31 and a capacitor 3. An emitter 13 is connected to an inductor 32 which is grounded, and a varistor 60 which is grounded through a capacitor 5, so that a positive feedback circuit is provided between the base and the emitter of the transistor 1. The varistor 60 has another transistor with a base coupled with a collector, an emitter coupled with the emitter 13 of the transistor 1. The base (and the collector) of the varistor 60 is coupled with the base voltage control terminal 14 through a resistor 41 which has the similar resistance to that of the resistor 8. A collector 12 of the transistor 1 is coupled with an output terminal 10 through an impedance matching circuit 20 and a capacitor 9. The impedance matching circuit 20 has further a collector voltage supply terminal 15.

When voltage is applied to the collector voltage supply terminal 15, the base of the transistor 1 shows capacitive negative impedance, and thus an oscillator is provided when an inductor 31 is connected to the base of the transistor 1. The base current of the transistor is controlled by the voltage applied to the base voltage control terminal 14. The base-emitter resistance $R_{be}$ of the transistor 1 functions as a varistor which depends upon base current, and operates equivalently as variable capacitance in a positive feedback circuit. Thus, the base shows variable capacitive negative impedance so that oscillation frequency changes. Thus, a voltage controlled oscillator is provided.

The twelfth embodiment has the similar advantage to the of FIG. 1, and further the twelfth embodiment has the advantage by the presence of the varistor 60 in the positive feedback circuit so that the control terminal of the varistor 60 is common to the base voltage control terminal 14. Therefore, a single voltage at the control terminal 14 may control both the base-emitter resistance $R_{be}$ of the transistor 1 and the resistance of the varistor 60, therefore, the range and/or the change ratio of variable reactance may be enlarged, or modified. Therefore, the twelfth embodiment increases the frequency tuning range of a voltage controlled oscillator, and improves frequency tuning sensitivity versus control voltage.

Figure 12B:
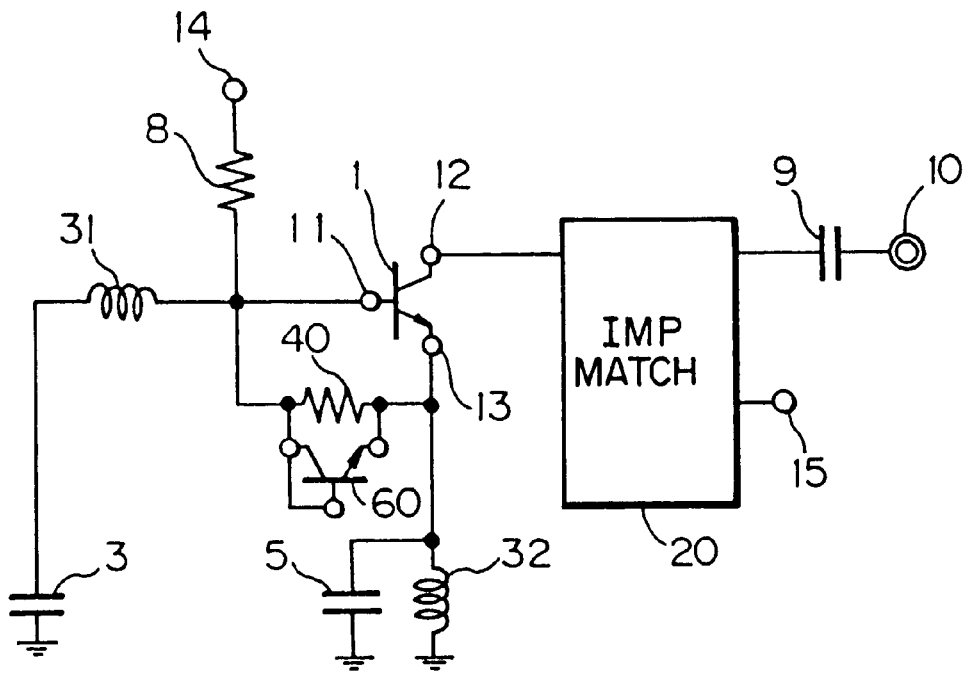
FIG. 12B is a modification of a voltage controlled oscillator of FIG. 12A.

FIG. 12B shows the modification of FIG. 12A. In FIG. 12B, the connection of the varistor 60 is modified so that it is coupled parallel to the resistor 40.

In twelfth embodiment, although a varistor 60 has a base coupled with a collector of a transistor, it is possible to couple a base with an emitter, further, a transmission line may be substituted with an inductor.

(Thirteenth embodiment)

Figure 13A:
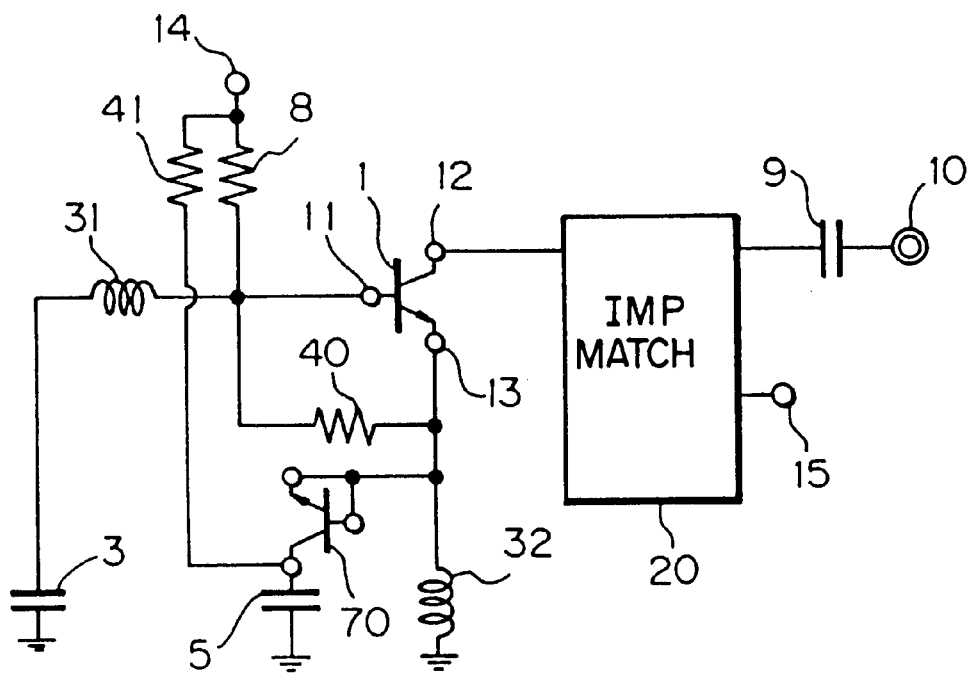
FIG. 13A is a circuit diagram of a thirteenth embodiment of a voltage controlled oscillator according to the present invention.

FIG. 13A shows thirteenth embodiment of a voltage controlled oscillator of the present invention. In FIG. 13A, the same numeral show the same members as those in FIG. 1.

In FIG. 13A, the numeral 1 is a transistor for negative resistance generator. The transistor 1 has a base 11 coupled with a base voltage control terminal 14 which operates as a first control terminal through a resistor 8, and grounded through a series circuit of an inductor 31 and a capacitor 3. An emitter 13 is coupled with an inductor 32 which is grounded, and a varactor 70 which is grounded through a capacitor 5, so that a positive feedback circuit is provided between a base and an emitter in viewing from the transistor 1. The varactor 70 has another transistor with a base coupled with an emitter, so that the capacitance $C_{bc}$ between the base and the collector depends upon the voltage between the base and the collector. The emitter (base) of the varactor 70 is connected to the emitter 13 of the transistor 1, and the collector of the varactor 70 is connected to the base voltage control terminal 14 through the resistor 41. The base 11 of the transistor 1 is connected to the emitter 13 through the resistor 40. A collector 12 of the transistor 1 is coupled with an output terminal 10 through an impedance matching circuit 20 and a capacitor 9. The impedance matching circuit 20 has further a collector voltage supply terminal 15.

When collector voltage is supplied to the collector voltage supply terminal 15, the base of the transistor 1 shows capacitive negative impedance, and therefore, an oscillator is provided when an inductor 31 is connected to the base 11. The base current of the transistor 1 is controlled by the voltage at the base voltage control terminal 14. The base-emitter resistance $R_{be}$ of the transistor 1 functions as a varistor which depends upon base current, and operates equivalently as variable capacitance in a positive feedback circuit, thus, the base shows variable capacitive negative impedance so that oscillation frequency changes. Thus, a voltage controlled oscillator is provided.

The thirteenth embodiment has the similar advantage to that of the first embodiment. Further, the varactor 70 is provided in a positive feedback circuit so that the control terminal of the varactor 70 is common to that of the base voltage control terminal 14. Thus, the single voltage can control both the base-emitter resistance $R_{be}$ (varistor) of the transistor 1 and the capacitance of the varactor 70, and therefore, the range and/or change ratio of variable reactance is increased and/or modified.

The thirteenth embodiment has the advantages that the tuning range of the voltage controlled oscillator is increased, and that the modulation sensitivity of the oscillation frequency for control voltage is improved.

Figure 13B:
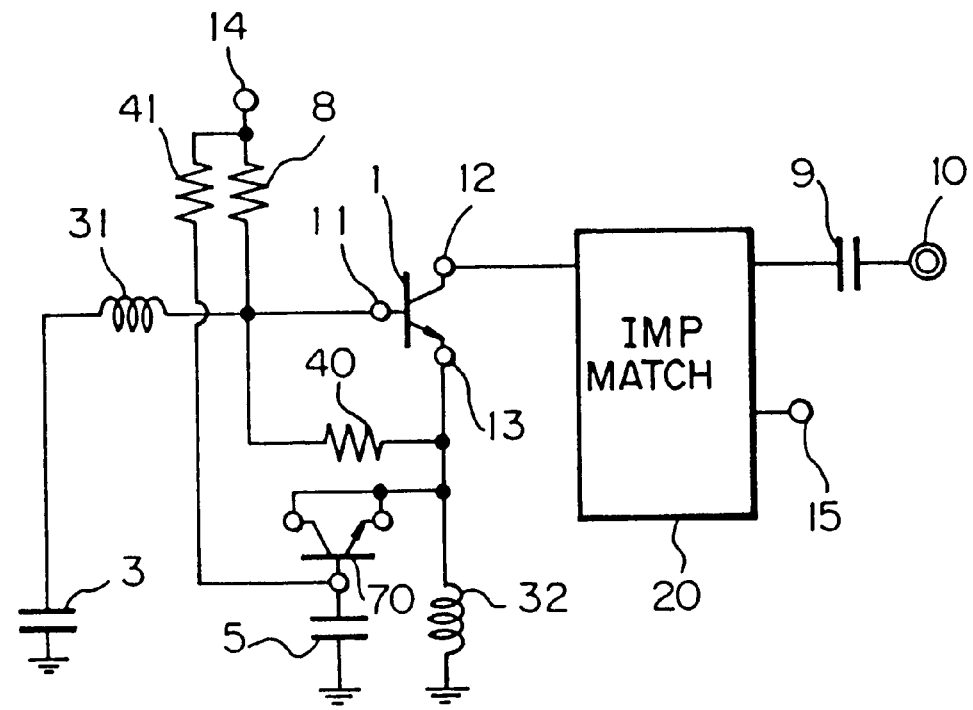
FIG. 13B is a modification of a voltage controlled oscillator of FIG. 13A.

FIG. 13B shows a modification of FIG. 13A. FIG. 13B has the feature that a collector and an emitter of a transistor are coupled together. In FIG. 13A, the emitter (base) of the varactor is connected to the emitter 13 of the transistor 1, and the collector of the varactor 70 is connected to the capacitor 5, but the opposite connection is possible, and provides the similar effect.

(Fourteenth embodiment)

Figure 14:
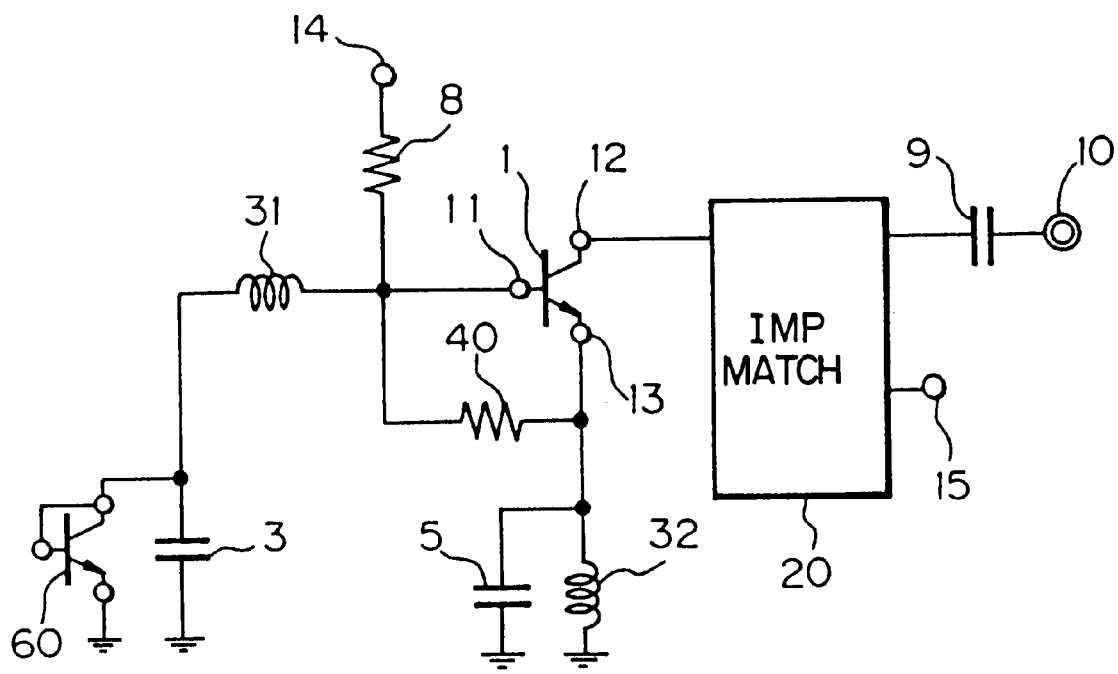
FIG. 14 is a circuit diagram of a fourteenth embodiment of a voltage controlled oscillator according to the present invention.

FIG. 14 shows fourteenth embodiment of a voltage controlled oscillator according to the present invention. The same numerals in FIG. 14 show the same members as those in FIG. 1.

In FIG. 14, the numeral 1 is a transistor for negative resistance generator. The transistor 1 has a base 11 coupled with a base voltage control terminal 14 which operates as a first control terminal through a resistor 8, and grounded through a series circuit of an inductor 31 and a parallel circuit of a capacitor and a varistor 60, which are grounded. The varistor 60 has another transistor with a base connected to a collector which is connected to the inductor 31, and an emitter grounded. An emitter 13 of the transistor 1 is grounded through a parallel circuit of an inductor 32 and a capacitor 5, so that a positive feedback circuit is provided between the base and the emitter of the transistor 1. The base 11 is coupled with the emitter terminal 14 through a resistor 40. A collector 12 of the transistor 1 is coupled with an output terminal 10 through an impedance matching circuit 20 and a capacitor 9. The impedance matching circuit 20 has further a collector voltage supply terminal 15.

When collector voltage is supplied to the collector voltage supply terminal 15, the base of the transistor 1 shows capacitive negative impedance, and then, an oscillator is provided when an inductance 31 is connected to the base 11. The base current of the transistor 1 is controlled by the voltage applied to the base voltage control terminal 14. The base-emitter resistance $R_{be}$ of the transistor 1 functions as a varistor which depends upon base current, and operates equivalently as variable capacitance in a positive feedback circuit. Thus, the base shows variable capacitive negative impedance so that oscillation frequency changes. Thus, a voltage controlled oscillator is provided.

Fourteenth embodiment has the similar advantage as that of twelfth embodiment. The varistor 60 in the positive feedback circuit provides a variable inductor (an inductor 31, a capacitor 3 and a varistor 60) connected to the base 11, therefore, the frequency tuning range is increased, and the modulation sensitivity of the oscillation frequency to the control voltage is increased and/or modified. In fourteenth embodiment, a varistor 60 has a base coupled with a collector which is connected to the inductor 31, and an emitter grounded, but it is possible to opposite the connections so that an emitter is connected to the inductor 31, and a base (collector) is grounded.

(Fifteenth embodiment)

Figure 15A:
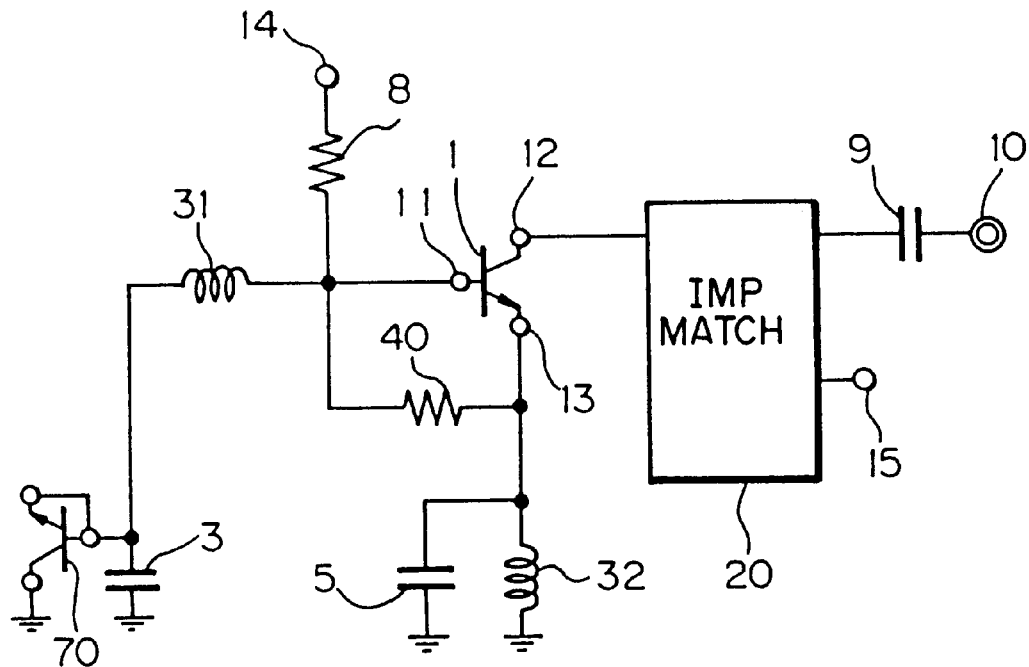
FIG. 15A is a circuit diagram of a fifteenth embodiment of a voltage controlled oscillator according to the present invention.

FIG. 15A shows fifteenth embodiment of a voltage controlled oscillator according to the present invention. In FIG. 15A, the same numerals show the same members as those in FIG. 1.

In FIG. 15A, the numeral 1 is a transistor for negative resistance generator. The transistor 1 has a base 11 coupled with a base voltage control terminal 14 through a resistor 8, and grounded through a series circuit of an inductor 31 and a parallel circuit of a capacitor 3 and a varactor 70. The varactor 70 has another transistor with a base coupled with an emitter connected to the inductor 31, and a collector grounded. An emitter 13 of the transistor 1 is grounded through a parallel circuit of an inductor 32 and a capacitor 5, so that a positive feedback circuit is provided between the base and the emitter of the transistor 1. The base 11 of the transistor 1 is connected to the emitter 13 through the resistor 40. A collector 12 of the transistor 1 is coupled with an output terminal 10 through an impedance matching circuit 20 and a capacitor 9. The impedance matching circuit 20 has further a collector voltage supply terminal 15.

When collector voltage is applied to the collector voltage supply terminal 15, the base of the transistor 1 shows capacitive negative impedance, and therefore, an oscillator is provided when an inductor 31 is connected to the base 11. The base current of the transistor 1 is controlled by the voltage at the base voltage control terminal 14. The base-emitter resistance $R_{be}$ of the transistor 1 functions as a varistor which depends upon base current, and operates equivalently as variable capacitance in a positive feedback circuit. Thus, the base of the transistor 1 shows variable capacitive negative impedance, so that oscillation frequency changes. Thus, a voltage controlled oscillator is provided.

Fifteenth embodiment has the similar advantage to that of thirteenth embodiment. The varactor 70 provided in a positive feedback circuit provides a variable inductor (an inductor 31, a capacitor 3, and a varactor 70), therefore, the frequency tuning range is considerably increased, and the modulation sensitivity of frequency change for control voltage is increased and/or modified.

Figure 15B:
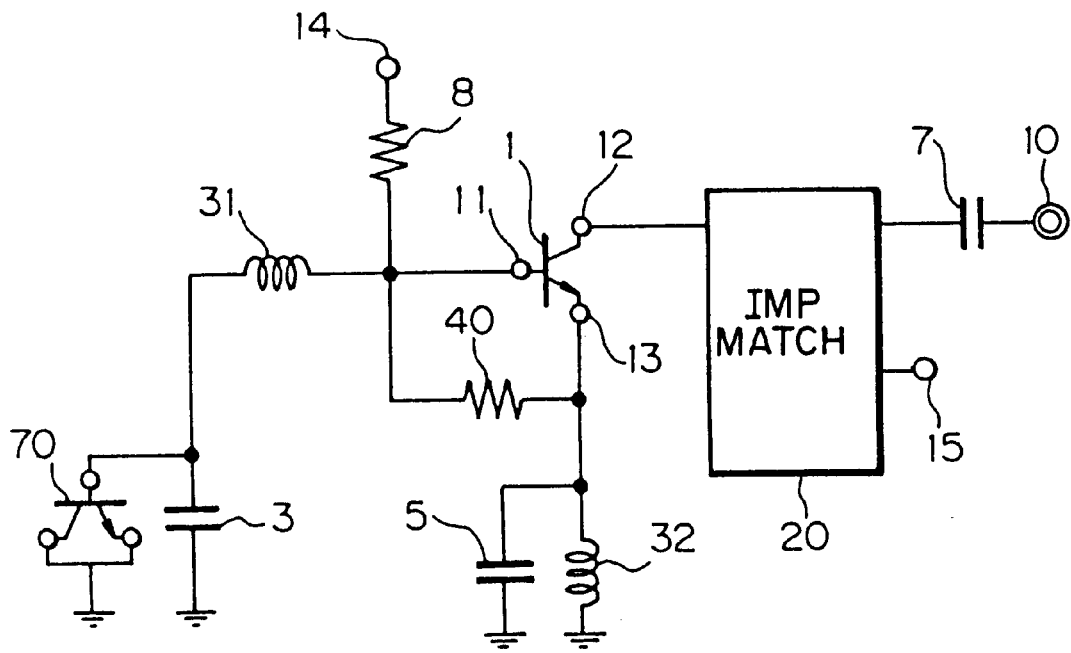
FIG. 15B is a modification of a voltage controlled oscillator of FIG. 15A.

FIG. 15B shows a modification of FIG. 15A. The feature of FIG. 15 is that an emitter and a collector of a varactor 70 are connected together. FIG. 15B provides the similar effect to that of FIG. 15A. Although a base (emitter) of the varactor is connected to the inductor 31 of FIG. 15A, it is possible to connect a collector to the inductor 31, and a base (emitter) grounded.

(Sixteenth embodiment)

Figure 16:
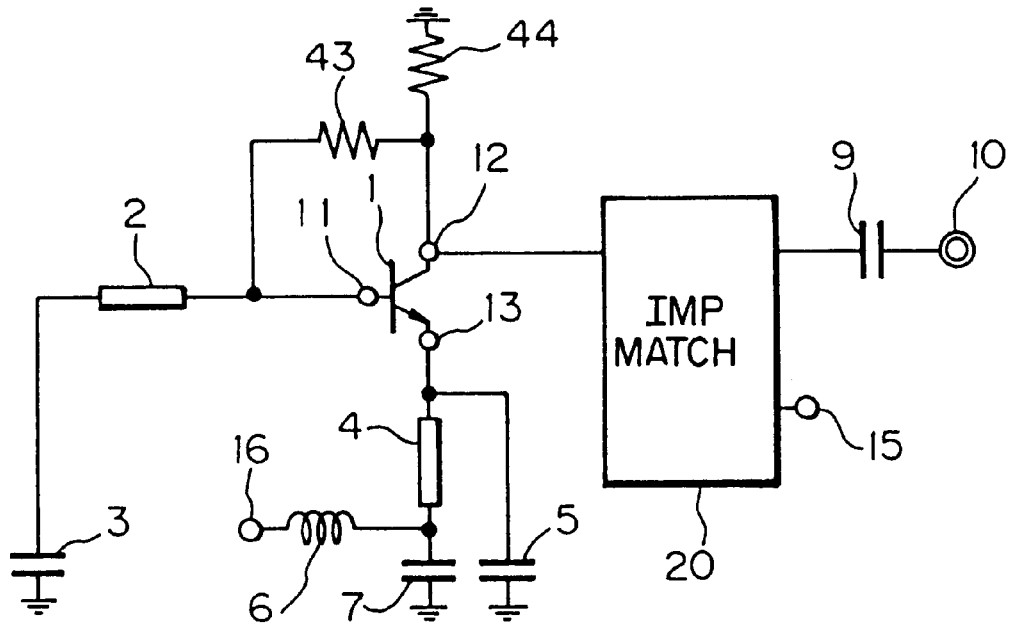
FIG. 16 is a circuit diagram of sixteenth embodiment of a voltage controlled oscillator according to the present invention.

FIG. 16 shows sixteenth embodiment of a voltage controlled oscillator according to the present invention. In FIG. 16, the same numerals show the same members in FIG. 1.

In FIG. 16, the numeral 1 is a transistor for negative resistance generator. The transistor 1 has a base 11 coupled with a collector 12 through a resistor 43, and grounded through a series circuit of a transmission line and a capacitor 3. An emitter 13 of the transistor 1 is connected to a capacitor 5 which is grounded, and a transmission line 4 which is grounded through a capacitor 7. A junction of the transmission line 4 and the capacitor 7 is coupled with an emitter voltage control terminal which operates as a second control terminal through an inductor 6. A positive feedback circuit is provided between the base and the emitter of the transistor 1. A collector 12 of the transistor 1 is grounded through a resistor 44, and coupled with an output terminal 10 through an impedance matching circuit 20 and a capacitor 9. The impedance matching circuit has further a collector voltage supply terminal 15.

When collector voltage is applied to the collector voltage supply terminal 10, the base of the transistor 1 shows capacitive negative impedance, and therefore, an oscillator is provided when a transmission line 2 is connected to the base 11. The base current in the transistor 1 is controlled by the voltage supplied to the emitter voltage control terminal 16. The base-emitter resistance $R_{be}$ of the transistor 1 functions as a varistor which depends upon base current, and operates equivalently as variable capacitance in a positive feedback circuit. Therefore, the base of the transistor 1 shows variable capacitive negative impedance, so that oscillation frequency changes. Thus, a voltage controlled oscillator is provided. The base current may be controlled by fixing collector voltage supplied to the collector voltage supply terminal 15, and adjusting control voltage supplied to the emitter voltage control terminal 16.

Sixteenth embodiment has the similar advantage to that of FIG. 1. In FIG. 16, the voltage applied to the base 11 of the transistor 1 is fixed to the divide ratio of the voltage supplied to the collector voltage supply terminal 15 by the resistors 43 and 44, thus, no base voltage control terminal is necessary. Therefore, a voltage controlled oscillator with a simple structure is obtained.

(Seventeenth embodiment)

Figure 17:
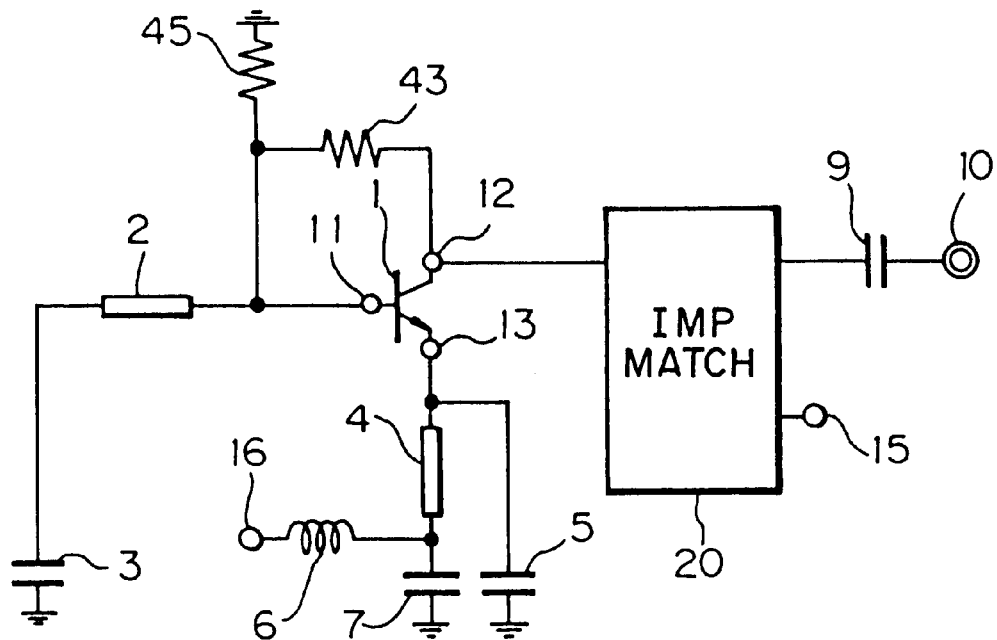
FIG. 17 is a circuit diagram of a seventeenth embodiment of a voltage controlled oscillator according to the present invention.

FIG. 17 shows seventeenth embodiment of a voltage controlled oscillator according to the present invention. In FIG. 17, the same numerals show the same members as those in FIG. 1.

In FIG. 17, the numeral 1 is a transistor for negative resistance generator. The transistor 1 has a base 11 coupled with a collector 12 through a resistor 43, and grounded through a series circuit of a transmission line 2 and a capacitor 3. A base 11 is further grounded through a resistor 45. An emitter 13 of the transistor 1 is connected to a capacitor 5 which is grounded, and a transmission line 4 which is grounded through a capacitor 7. A junction of the transmission line 4 and the capacitor 7 is coupled with an emitter voltage control terminal 16 which operates as a second control terminal through an inductor 6. A positive feedback circuit is provided between the base and the emitter of the transistor 1. A collector 12 of the transistor 1 is coupled with an output terminal 10 through an impedance matching circuit 20 and a capacitor 9. The impedance matching circuit 20 has further a collector voltage supply terminal 15.

When collector voltage is applied to the collector voltage supply terminal 15, the base of the transistor 1 shows capacitive negative impedance, and therefore, an oscillator is provided when a transmission line 2 is connected to the base 11. The base current of the transistor 1 is controlled by the voltage at the emitter voltage control terminal 16. The base-emitter resistance $R_{be}$ of the transistor 1 functions as a varistor which depends upon base current, and operates equivalently as variable capacitance in a positive feedback circuit. Thus, the base shows variable capacitive negative impedance so that oscillation frequency changes. Thus, a voltage controlled oscillator is provided. The base current is controlled by fixing collector voltage supplied to the collector voltage supply terminal 15, and controlling voltage supplied to the emitter voltage control terminal 16.

Seventeenth embodiment has the similar advantage to that of FIG. 1. In FIG. 17, the voltage applied to the base 11 of the transistor 1 is fixed to the divide ratio of the collector voltage divided by the resistors 43 and 45, thus, no base voltage control terminal is necessary. Therefore, a voltage controlled oscillator with simple structure is obtained.

(Eighteenth embodiment)

Figure 18:
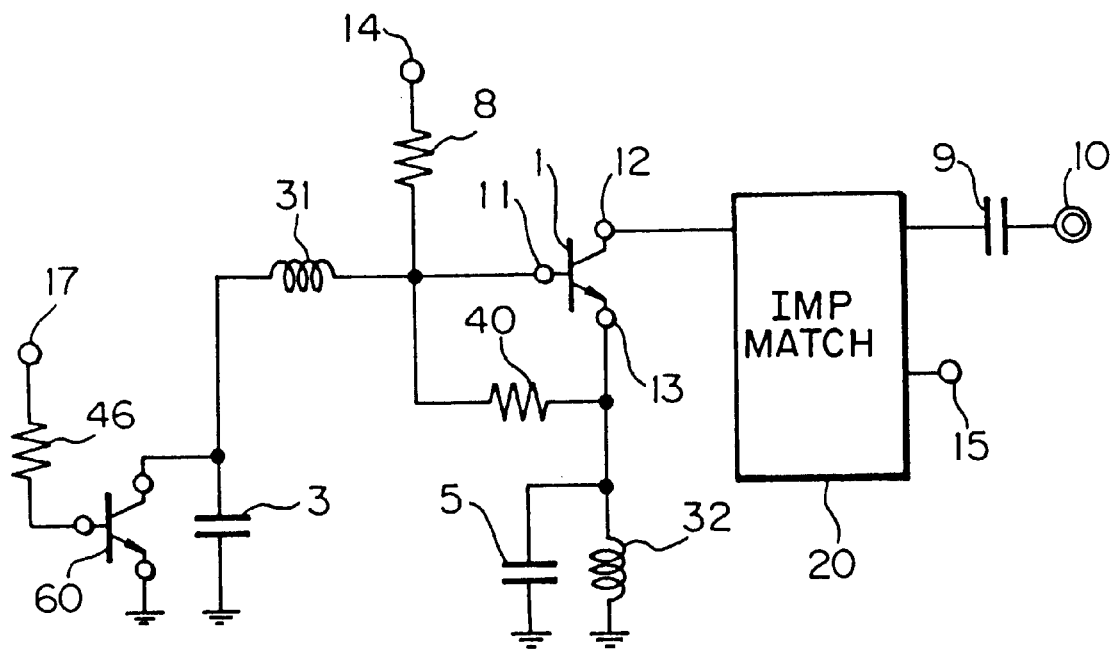
FIG. 18 is a circuit diagram of an eighteenth embodiment of a voltage controlled oscillator according to the present invention.

FIG. 18 shows eighteenth embodiment of a voltage controlled oscillator according to the present invention. In FIG. 18, the same numerals show the same members as those in FIG. 1.

In FIG. 18, the numeral 1 is a transistor for negative resistance generator. The transistor 1 has a base 11 coupled with a base voltage control terminal 14 through a resistor 8, and is grounded through a series circuit of an inductor 31, and a parallel circuit of a capacitor 3 and a varistor 60. The varistor 60 has another transistor with a base coupled with a varistor control terminal 17 through a resistor 46, a collector coupled with said inductor 31, and an emitter grounded.

An emitter 13 of the transistor 1 is grounded through a parallel circuit of an inductor 32 and a capacitor 5, so that a positive feedback circuit is provided between the base and the emitter of the transistor 1. The base 11 and the emitter 13 of the transistor 1 are coupled through a resistor 40. A collector 12 of the transistor 1 is coupled with an output terminal 10 through an impedance matching circuit 20 and a capacitor 9. The impedance matching circuit 20 has further a collector voltage supply terminal 15.

When collector voltage is supplied to the collector voltage supply terminal 15, the base of the transistor 1 shows capacitive negative impedance, and therefore, an oscillator is provided when an inductor 31 is connected to the base 11. The base current of the transistor 1 is controlled by the voltage applied to the base voltage control terminal 14. The base-emitter resistance $R_{be}$ of the transistor 1 functions as a varistor which depends upon base current, and operates equivalently as variable capacitance in a positive feedback circuit. Therefore, the base shows variable capacitive negative impedance so that oscillation frequency changes. Thus, a voltage controlled oscillator is obtained.

Eighteenth embodiment has the similar advantage to that of first embodiment. In FIG. 18, the varistor 60 provides a variable inductor to the base 11 by the inductor 31, the capacitor 3 and the varistor 60, thus, the frequency tuning range is increased, and the modulation sensitivity of frequency change for control voltage is increased and/or adjusted. As a modification, an emitter of the varistor 60 may be connected to the inductor 31, instead of a collector connected to the inductor 31, and in that case, a collector is to be grounded.

(Nineteenth embodiment)

Figure 19:
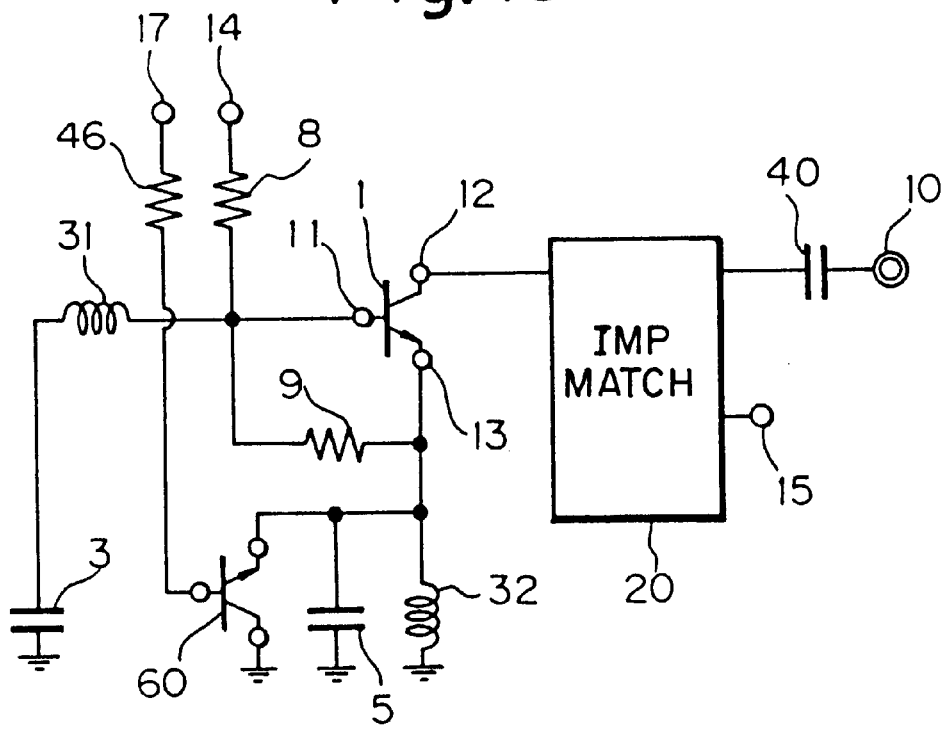
FIG. 19 is a circuit diagram of a nineteenth embodiment of a voltage controlled oscillator according to the present invention.

FIG. 19 shows nineteenth embodiment of a voltage controlled oscillator according to the present invention. In FIG. 19, the same numerals show the same members as those in FIG. 1.

In FIG. 19, the numeral 1 is a transistor for negative resistance generator. The transistor 1 has a base 11 coupled with a base voltage control terminal 14 through a resistor 8, and grounded through a series circuit of an inductor 31 and a capacitor 3. An emitter 13 of the transistor 1 is connected to a capacitor 5 which is grounded, an inductor 32 which is grounded, and a varistor 60. A positive feedback circuit is provided between the base and the emitter of the transistor 1. The varistor 60 has another transistor with a base coupled with a varistor control terminal 17 through a resistor 46, an emitter connected to the emitter of the transistor 1, and a collector which is grounded. The base 11 and the emitter 13 of the transistor 1 are connected together through a resistor 40. A collector of the transistor 1 is coupled with an output terminal 10 through an impedance matching circuit 20 and a capacitor 9. The impedance matching circuit 20 has further a collector voltage supply terminal 15.

When collector voltage is supplied to the collector voltage supply terminal 15, the base of the transistor 1 shows capacitive negative impedance, and thus, an oscillator is provided when an inductor 31 is connected to the base 11. The base current of the transistor 1 is controlled by voltage applied to the base voltage control terminal 14. The base-emitter resistance $R_{be}$ of the transistor 1 functions as a varistor which depends upon base current, and operates equivalently as variable capacitance in a positive feedback circuit. Thus, the base shows variable capacitive negative impedance so that oscillation frequency changes. Thus, a voltage controlled oscillator is provided.

Nineteenth embodiment has not only the similar advantage to that of first embodiment, but also following advantages. The presence of a varistor 60 in a positive feedback circuit provides increase or adjustment of turning range or tuning ratio of variable reactance. Therefore, nineteenth embodiment increases frequency tuning range, and improves or adjusts modulation sensitivity of variable frequency for control voltage. As a modification of FIG. 19, a varistor 60 may have a collector coupled with the emitter of the transistor 1, instead of an emitter coupled with the emitter of the transistor 1, and in that case a collector of the transistor is to be grounded.

As described above in detail, it is apparent that a new and improved voltage controlled oscillator has been found. It should be appreciated of course that the embodiments disclosed are merely illustrative and are not intended to limit the scope of the invention. Reference should be made therefore to the appended claims as indicating the scope of the invention.

What is claimed is:

1. A voltage controlled oscillator comprising:
    a first transistor having a positive feedback circuit between a base and an emitter of said transistor,
    an oscillation output of the oscillator being provided from a collector of said transistor to an output terminal through an impedance matching circuit,
    an inductor element connected to the base of the transistor,
    a control source connected to said base and said emitter and for providing adjustable potential to at least one of said base and said emitter of said transistor,
    said impedance matching circuit having a power supply terminal for supplying collector voltage to the collector of said transistor,
    a first resistor provided between the base of said transistor and said control source which provides the base potential of said transistor, and
    at least one of an inductor and a transmission line provided between the emitter and the control source for applying potential to said emitter.

2. A voltage controlled oscillator comprising:
    a first transistor having a positive feedback circuit between a base and an emitter of said transistor,
    an oscillation output of the oscillator being provided from an emitter of said transistor through a capacitor,
    an inductor element connected to the base of the transistor,
    a control source connected to said base and said emitter and for providing adjustable potential to at least one of said base and said emitter of said transistor,
    an impedance matching circuit having a power supply terminal for supplying collector voltage to the collector of said transistor,
    a first resistor provided between the base of said transistor and said control source which provides the base potential of said transistor, and
    at least one of an inductor and a transmission line provided between the emitter and the control source for applying potential to said emitter.

3. A voltage controlled oscillator according to one of claim 1 or 2, wherein said emitter is grounded through one of an inductor and a transmission line.

4. A voltage controlled oscillator according to one of claim 1 or 2, further comprising another resistor provided between said base and said emitter of said transistor.

5. A voltage controlled oscillator according to one of claim 1 or 2, further comprising a capacitor provided between said base and said emitter of said transistor.

6. A voltage controlled oscillator according to one of claim 1 or 2, further comprising an inductor element coupled with the base of said transistor through a capacitor.

7. A voltage controlled oscillator according to one of claim 1 or 2, further comprising a varistor inserted between said first resistor and said control source.

8. A voltage controlled oscillator according to one of claim 1 or 2, wherein a varistor is provided between said control source, and another control source which controls said varistor.

9. A voltage controlled oscillator according to claim 7, wherein said varistor is implemented by using another transistor.

10. A voltage control oscillator according to one of claim 1 or 2, wherein said positive feedback circuit has a capacitor, which has a variable impedance element coupled with said capacitor, said variable impedance element having a second transistor which is controlled by the same control source as the control source which supplies potential to a base or an emitter of the first transistor.

11. A voltage controlled oscillator according to claim 10, wherein said variable impedance element is a varistor having a transistor.

12. A voltage controlled oscillator according to claim 10, wherein said variable impedance element is a varactor having a transistor.

13. A voltage controlled oscillator according to claim 10, wherein said variable impedance element is controlled by another control source.

14. A voltage controlled oscillator according to one of claim 1 or 2, wherein the base and the collector of said first transistor are coupled together through a resistor, and said collector grounded through a resistor.

15. A voltage controlled oscillator according to one of claim 1 or 2, wherein said base and said collector are coupled together through a resistor, and said base grounded through a resistor.

16. A voltage controlled oscillator according to one of claim 1 or 2, wherein said transistor is a bipolar transistor.

17. A voltage controlled oscillator according to one of claim 1 or 2, wherein said transistor is deposited on a silicon substrate.

* * * * *